(12) United States Patent
Hamamoto et al.

(10) Patent No.: US 6,333,892 B2
(45) Date of Patent: Dec. 25, 2001

(54) SYNCHRONOUS SEMICONDUCTOR MEMORY DEVICE CAPABLE OF SELECTING COLUMN AT HIGH SPEED

(75) Inventors: Takeshi Hamamoto; Zenya Kawaguchi; Motoko Hara, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/725,851

(22) Filed: Nov. 30, 2000

Related U.S. Application Data

(62) Division of application No. 09/265,856, filed on Mar. 11, 1999.

(30) Foreign Application Priority Data

Jul. 29, 1998 (JP) .................................................. 10-213950

(51) Int. Cl.[7] .................................................. G11C 8/00
(52) U.S. Cl. ............................... 365/230.08; 365/230.09; 365/233; 365/236
(58) Field of Search ..................... 365/230.08, 230.09, 365/233, 230.01, 236

(56) References Cited

U.S. PATENT DOCUMENTS

| 5,467,315 | 11/1995 | Kajimoto et al. . | |
|---|---|---|---|
| 5,568,445 | * 10/1996 | Park et al. | 365/233 |
| 5,581,512 | * 12/1996 | Kitamura | 365/233 |
| 5,867,446 | * 2/1999 | Konishi et al. | 365/233 |
| 5,867,447 | * 2/1999 | Koshikawa | 365/233 |
| 5,892,730 | 4/1999 | Sato et al. . | |
| 5,953,267 | 9/1999 | Oh . | |
| 5,959,906 | 9/1999 | Song et al. . | |

FOREIGN PATENT DOCUMENTS 02-143444   6/1990   (JP) .

\* cited by examiner

*Primary Examiner*—Hoai V. Ho
(74) *Attorney, Agent, or Firm*—McDermott, Will & Emery

(57) ABSTRACT

A command decoder receives an externally supplied command independently of an internal clock signal, decodes the command, generates a column access mode instruction signal, and activates a column address activation signal when the internal clock signal rises. An internal column address signal generating circuit generates an internal column address signal from an externally supplied address signal according to the column address activation signal. Accordingly, the internal column address is generated at an advanced timing to enable a following column selecting operation to be started at a faster timing. A synchronous semiconductor memory device capable of performing the column selecting operation at a high speed is thus provided.

7 Claims, 20 Drawing Sheets

: WITHOUT INTERCONNECTION LINE 108a

WITH INTERCONNECTION LINE 108b

: WITH INTERCONNECTION LINE 108a

WITHOUT INTERCONNECTION LINE 108b

SYNCHRONOUS SEMICONDUCTOR MEMORY DEVICE CAPABLE OF SELECTING COLUMN AT HIGH SPEED

This application Div. of Ser. No. 09/265,856, filed Mar. 11, 1999.

BACKGROUND OF THE INVENTION

1. Field of the Invention

The present invention relates to a synchronous semiconductor memory device, and particularly to a configuration of column-selection-related circuitry for achieving a high-speed column selecting operation. More specifically, the present invention relates to a configuration of circuitry related to internal column addresses in the synchronous semiconductor memory device.

2. Description of the Background Art

FIG. 44 is a schematic diagram showing an entire structure of a conventional synchronous semiconductor memory device. Referring to FIG. 44, the conventional synchronous semiconductor memory device includes a memory cell array 900 having a plurality of memory cells MCs arranged in rows and columns. In memory cell array 900, word lines WLs corresponding to respective rows of the memory cells and bit line pairs BLPs corresponding to respective columns of the memory cells are arranged.

The synchronous semiconductor memory device further includes: a clock input buffer 902 buffering an externally supplied clock signal extCLK to generate an internal clock signal CLK; a command decoder 904 determining the states of control signals that are externally supplied synchronously with internal clock signal CLK, i.e., a chip select signal /CS, a row address strobe signal /RAS, a column address strobe signal /CAS, and a write enable signal /WE, and generating an operation mode instruction signal indicating an operation mode according to the result of the determination; a control circuit 906 generating (activating) various control signals for performing the operation mode designated by the operation mode instruction signal from command decoder 904; an internal address generating circuit 908 taking in an externally supplied address signal ADD in synchronization with internal clock signal CLK, passing the address signal according to a signal from command decoder 904, and latching the address signal under the control of control circuit 906 to generate an internal row/column address signal; a row selecting circuit 910 for driving a word line corresponding to an addressed row of memory cell array 900 to a selected state according to the internal row address signal from internal address generating circuit 908 under the control of control circuit 906; and a column selecting circuit 912 for selecting an addressed column of memory cell array 900 according to the internal column address signal from internal address generating circuit 908 under the control of control circuit 906.

Command decoder 904 detects the states of chip select signal /CS, row address strobe signal /RAS, column address strobe signal /CAS, and write enable signal /WE at rising of clock signal CLK and determines the designated operation mode based on the detected states. The combination of the states of these control signals is referred to as "command". Command decoder 904 thus decodes a command to generate an operation mode instruction signal indicating the designated operation mode.

Row selecting circuit 910 includes a decode circuit decoding the internal row address signal from internal address generating circuit 908 to generate a row selection signal, and a word line drive circuit driving a word line corresponding to a selected row to a selected state according to the row selection signal. Column selecting circuit 912 includes a column decode circuit (which may include a predecoder) decoding the internal column address signal from internal address generating circuit 908, and a column selection gate corresponding to each column of memory cell array 900 for selecting a corresponding column and coupling the column to an internal data bus according to a column selection signal from the column decode circuit.

The synchronous semiconductor memory device further includes a read/write circuit 914 supplying/receiving data to/from a selected memory cell via column selecting circuit 912 synchronously with internal clock signal CLK under the control of control circuit 906, and an input/output circuit 916 operating under control of control circuit 906 for communicating data between read/write circuit 914 and an external unit.

Referring to the timing chart illustrated in FIG. 45, an operation of the synchronous semiconductor memory device shown in FIG. 44 is briefly described.

An active command ACT is supplied in clock cycle #a. The active command is issued by setting chip select signal /CS and row address strobe signal /RAS to a logical low or L level, and setting column address strobe signal /CAS and write enable signal /WE to a logical high or H level. When active command ACT is supplied, command decoder 904 decodes the command, drives an array activation instruction signal φact into an active state, and supplies it to control circuit 906. Control circuit 906 activates row selecting circuit 910 according to array activation instruction signal φact, and causes internal address generating circuit 908 to generate an internal row address signal.

Internal address generating circuit 908 takes in external address signal ADD synchronously with rising of clock signal CLK, latches the external address signal according to array activation instruction signal tact from command decoder 904, and generates an internal row address signal under the control of control circuit 906. Row selecting circuit 910 then drives an addressed row of memory cell array 906 to a selected state according to the internal row address signal from internal address generating circuit 908. When row selecting circuit 910 operated, data of memory cells of one row connected to a selected row (selected word line) WL is amplified to be latched by a sense amplifier (not shown) under the control of control circuit 906.

In clock cycle #d, a read command RD is supplied. Read command RD is issued by setting chip select signal /CS and column address strobe signal /CAS to L level, and setting row address strobe signal /RAS and write enable signal /WE to H level. The read command instructs reading of data, and command decoder 904 accordingly supplies a reading operation instruction signal φor to control circuit 906. Internal address generating circuit 908 takes in external address signal ADD synchronously with clock signal CLK, generates an internal column address signal from the received external address signal in response to the reading operation instruction signal from command decoder 904, and latches the generated internal address signal under the control of control circuit 906.

Column selecting circuit 912 performs the column selecting operation according to the column address signal from internal address generating circuit 908, and selects an addressed column in memory cell array 900. Data of a selected memory cell is read synchronously with clock signal CLK via read/write circuit 914 and input/output circuit 916 under the control of control circuit 906. The period required from supply of read command RD to external output of valid data is referred to as CAS latency. FIG. 45 illustrates waveforms in data reading with the CAS latency of 2. The number of data that are consecutively read after one read command is supplied is referred to as a burst length. FIG. 45 illustrates a data reading operation with the burst length of 2. Accordingly, after two clock cycles from supply of read command RD, in two clock cycles #f and #g, data Q0 and Q1 are defined to be sampled by an external unit.

In clock cycle #h, a write command WR is supplied to designate writing of data. Write command WR is issued by setting chip select signal /CS, column address strobe signal /CAS, and write enable signal /WE all to L level, and setting row address strobe signal /RAS to H level. When write command WR is supplied, command decoder 904 activates a writing operation instruction signal φw and supplies it to control circuit 906. In response to activation of writing operation instruction signal φw from command decoder 904, internal address generating circuit 908 generates an internal column address signal from address ADD taken synchronously with internal clock signal CLK, and latches it under the control of control circuit 906. Column selecting circuit 912 again performs the column selecting operation according to the internal column address signal, and data D0 which is supplied simultaneously with write command WR in the clock cycle is taken to be written into a selected memory cell. FIG. 45 illustrates the data writing operation with the burst length of 2. Data D0 and D1 supplied in clock cycles #h and #i are written into selected memory cells synchronously with the clock signal according to a prescribed sequence.

When data for the burst length are read/written, a burst address counter included in internal address generating circuit 908 operates to internally generate a column address signal in a prescribed sequence, and the column selecting operation is performed according to the column address signal from the burst address counter.

In the synchronous semiconductor memory device, externally supplied signals /CAS, /RAS, /CS /WE and address signal ADD are taken synchronously with clock signal CLK, and data are input/output synchronously with clock signal CLK. As to these external signals, it is enough to consider the skew of the external signals relative to clock signal CLK, and consideration of the skew between the external signals is unnecessary, so that an internal signal can be so generated at a high speed as to start an internal operation at an advanced tiling. Further, data are input/output synchronously with clock signal CLK and equivalently the burst length data are input/output at the frequency of clock signal CLK, so that data are input/output at a high speed.

FIG. 46 schematically illustrates a sequence of a column selecting operation of the conventional synchronous semiconductor memory device. An address buffer is commonly provided to a row address signal and a column address signal. In response to rising of internal clock signal CLK, the address buffer generates an internal address signal. The generated internal address signal is taken as a column address signal to be latched according to a read command or a write command (hereinafter referred to collectively as access command). The taken internal column address signal is output as a valid column address signal to be supplied to a predecoder/decoder. Spare determination for determining whether the valid internal column address signal designates a defective column or not is made. If a defective column is addressed, the defective column has to be replaced by a redundant column. After the spare determination is done, a normal column decoding operation is performed when a normal column is selected, and a column selection line CSL is driven to a selected state. Accordingly, time period T is necessary from the time of rising of clock signal CLK to H level to start a clock cycle to the time at which a signal on column selection line CSL attains a definite state. Internal clock signal CLK is a clock signal which is synchronous with external clock signal extCLK. As the clock frequency becomes higher, the clock cycle becomes shorter. Therefore, time T should be made as short as possible for accessing to data of memory cells. In particular, in order to use the synchronous semiconductor memory device as a main memory for the recently employed processor that operates according to a high speed clock signal of 100 MHz or 200 MHz, the time required for internally selecting memory cells should be made as short as possible to minimize so called "column access time (CAS access time)". The CAS access time is a time period required from supply of a read command to an external actual reading of memory cell data. Various improvements in terms of the circuit or the layout are made in order to minimize time T which is necessary from rising of clock signal CLK to driving of an addressed column to a selected state. However, there still remains room for improvement in the approach for shortening time T.

SUMMARY OF THE INVENTION

An object of the present invention is to provide a synchronous semiconductor memory device in which the time required for column selection can be reduced sufficiently.

Another object of the present invention is to provide a synchronous semiconductor memory device capable of generating an internal column address signal in a definite state at a high speed from an external address signal.

Still another object of the present invention is to provide a synchronous semiconductor memory device capable of performing a column decode operation at a timing as fast as possible.

A synchronous semiconductor memory device according to a first aspect of the present invention includes a memory array having a plurality of memory cells arranged in rows and columns, an address input gate passing an externally supplied address signal in synchronization with a clock signal, an address generating circuit generating a complementary internal address signals according to the address signal from the address input gate, and a column selection signal generating circuit generating a column selection signal which designates a column of the memory array according to the complementary internal address signals from the address generating circuit.

A synchronous semiconductor memory device according to a second aspect includes an access command decode circuit receiving an externally supplied command independently of a clock signal to decode the command for activating a column access mode instruction signal when the command is an access command which designates column selection (column access), a first circuit taking and latching the column access mode instruction signal from the access command decoding circuit synchronously with the clock signal to generate a column address activation signal, and a first address generating circuit generating an internal column address signal from an externally supplied address signal according to the column address activation signal from the first circuit.

A synchronous semiconductor memory device according to a third aspect includes: an access command decode circuit receiving and decoding an externally supplied command for generating a column access instruction signal synchronously with a clock signal when the command is an access command instructing column selection; a read command decode circuit generating a read trigger signal synchronously with the clock signal when the received command instructs a data writing operation; a write command decode circuit generating a write trigger signal synchronously with the clock signal when the received command instructs a data writing operation; a circuit generating a column address activation signal in response to the column access instruction signal; a counter taking an externally supplied address signal in response to activation of the column access instruction signal, and performing a counting operation synchronously with the clock signal according to a prescribed sequence with the taken external address signal being an initial value; a circuit generating a counter address activation signal which makes an address of the counter valid in response to the clock signal in a cycle of the clock signal following a cycle in which the access command is supplied, when the column access instruction signal is activated; a column address generating circuit generating an internal column address signal from the external address signal synchronously with the clock signal in response to activation of the column address activation signal, and generating an internal column address signal from a count value of the counter when the counter address activation signal is activated; a column selection signal generating circuit generating a column selection signal for selecting a column of memory cells according to the internal column address signal from the column address generating circuit when activated and a control circuit activating the column selection signal generating circuit according to activation of one of the read trigger signal and the write trigger signal, or activation of one of the column address activation signal and the counter address activation signal. The control circuit includes means for alternatively validating a set of trigger signals and a set of address activation signals.

A circuit configuration of a column address input portion can be simplified by generating complementary address signals synchronously with a clock signal, and accordingly an address signal can be transmitted at a high speed to generate an internal address signal.

A logic gate is unnecessary for generating complementary column address signals according to the result of command decoding since complementary internal address signals are generated according to the clock signal, so that complementary internal column address signals can be generated at a high speed.

A column address signal is reset in each clock cycle so that the column address signal can be changed in each clock cycle without affection by an address signal in a preceding cycle. Accordingly, the column address signal can be set into a definite state at an advanced timing to achieve a high speed access.

A command is decoded independently of the clock signal so that decoding of the command can be started at advanced timing after rising of the clock signal. Accordingly, an operation mode instruction signal can be driven into the definite state at an advanced timing and thus, an internal column address signal can be defined at a best timing.

An internal column address signal is predecoded according to a column address activation signal so that generation and predecoding of the internal column address signal can be done in one stage of logic gate, and a predecode signal can be generated at a higher speed compared with the configuration in which the internal column address signal is generated and thereafter the internal column address signal is predecoded.

Further, in spare determination, a supplied address signal attains the definite state at a fast timing so that the spare determination can be made at a high speed and the column decoding operation can be started at an advance timing.

In addition, the determination circuit is configured to increase the speed of its determining operation and accordingly, a high speed determining operation is possible.

In the predecoder, an output of an inverter receiving a group specification bit is used as one operation power supply voltage of a circuit which decodes a column specifying address bit. Accordingly, an output load of the inverter of the group specifying bit is reduced and thus a high speed predecoding operation is possible.

A signal for activating a column decoder is activated by using one of a set of read trigger signal and a write trigger signal and a set of a column address activation signal and a counter address activation signal. Accordingly, a column decoding operation is performed at an optimum timing according to the frequency of the clock signal used, and a column selection signal can be driven into the definite state at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Overall Structure

Figure 1:
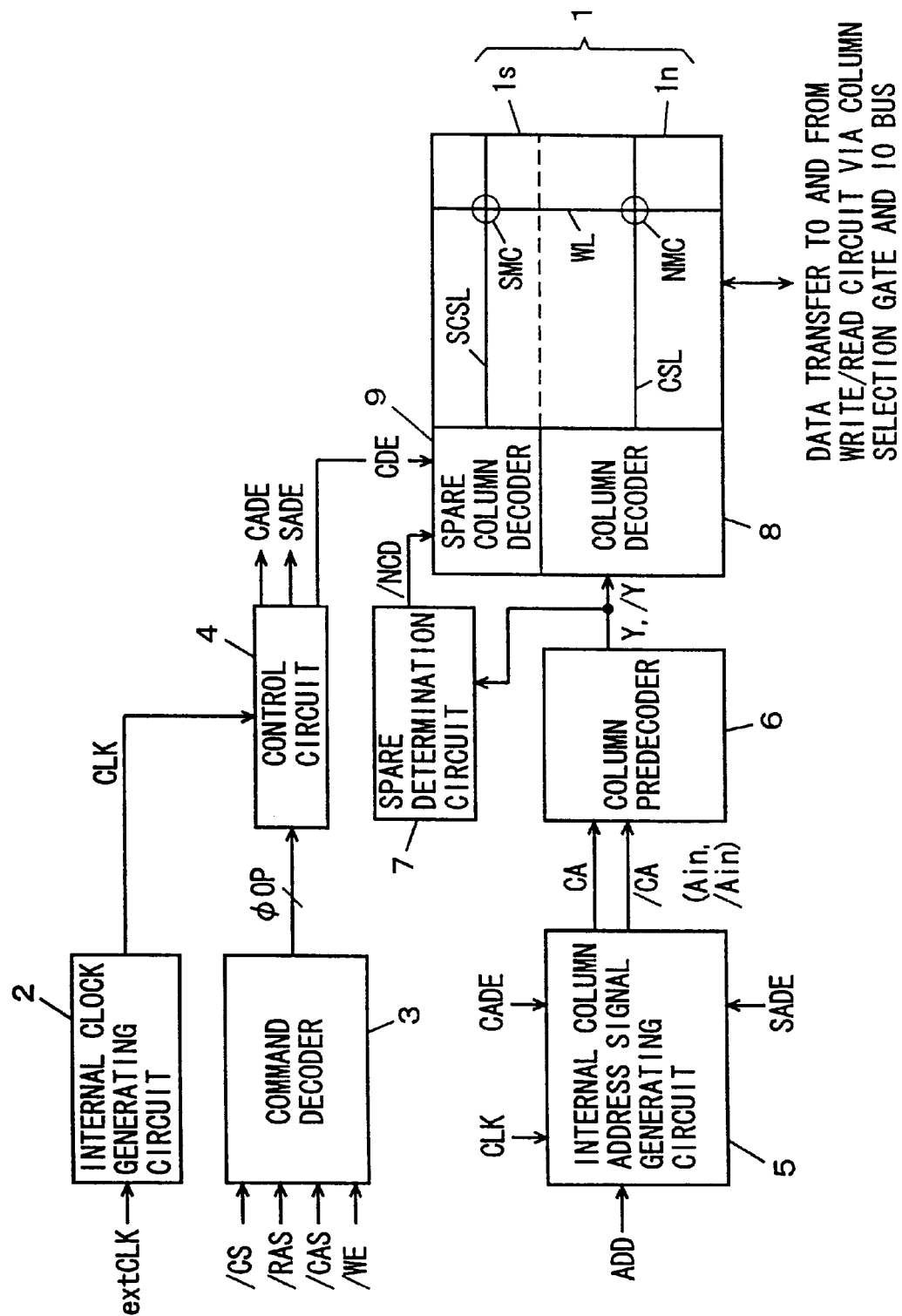
FIG. 1 is a schematic diagram illustrating an entire structure of a synchronous semiconductor memory device according to the present invention.

FIG. 1 is a schematic diagram illustrating a structure of a portion related to column selection of a synchronous semiconductor memory device according to the present invention. Referring to FIG. 1, the synchronous semiconductor memory device according to the present invention includes a memory allay 1 having a plurality of memory cells arranged in rows and columns. Memory array 1 includes a normal memory array 1n having normal memory cells NMCs arranged in rows and columns, and a spare memory array 1s having spare memory cells SMCs arranged in rows and columns for repairing a defective column in normal memory array 1n. Although normal memory array 1n and spare memory array 1s are shown being arranged separately, spare memory cells SMCs in spare memory array 1s may be dispersed in normal memory array 1n. In other words, a configuration that normal memory allay in is divided into a plurality of column blocks and columns of the spare memory cells are arranged at each column block may be used.

The synchronous semiconductor memory device further includes: internal clock generating circuit 2 receiving an externally supplied clock signal extCLK to generate an internal clock signal CLK which is in synchronization with the external clock signal, a command decoder 3 receiving externally supplied control signals /CS, /RAS, /CAS, and /WE independently of from internal clock signal CLK and decoding them to generate an operation mode instruction signal φop for instructing an operation mode designated by a command, and a control circuit 4 generating various operation mode activation signals synchronously with internal clock signal CLK from internal clock generating circuit 2 according to the operation mode instruction signal from command decoder 3.

Command decoder 3 receives an externally supplied command (externally supplied control signals /CS, ERAS, /CAS and /WE) independently of internal clock signal CLK, and decodes the received command independently of internal clock signal CLK, so that an operation for decoding the command can be performed at a timing preceding the time at which internal clock signal CLK rises. As a result, internal operation mode instruction signal φop can be driven into a definite state at an advanced timing to start an internal operation at an advanced timing.

Internal clock generating circuit 2 may be configured by any of a buffer, a PLL (Phase Locked Loop), and DLL (Delayed Locked Loop).

Control circuit 4 generates various control signals according to the operation mode instruction signal from command decoder 3. FIG. 1 representatively shows a column address activation signal CADE, a counter address activation signal (serial address activation signal) SADE, and a column decoder activation signal CDE supplied from control circuit 4.

The synchronous semiconductor memory device further includes an internal column address signal generating circuit 5 generating complementary internal address signals from an external address signal ADD according to internal clock signal CLK, and generating complementary internal column address signals CA and /CA according to column address activation signal CADE and counter address activation signal SADE, a column predecoder 6 predecoding internal column address signals CA and /CA from internal column address signal generating circuit 5, a spare determination circuit 7 receiving predecode signals Y and /Y from column predecoder 6 to determine whether a defective column is designated or not, a column decoder 8 selectively activated according to a normal column decoder disable signal /NCD from spare determination circuit 7 and column decoder activation signal CDE from control circuit 4, for decoding the predecode signal from column predecoder 6, to select a memory cell column in normal memory array 1n, and a spare column decoder 9 selectively activated according to normal column decoder disable signal /NCD from spare determination circuit 7 and column decoder activation signal CDE, for selecting a redundant column replacing the defective column in spare memory array 1s.

Spare determination circuit 7 includes a programming circuit storing a column address of a defective column therein, compares the predecode signal from column predecoder 6 with the stored defective column address, for activating one of the spare column decoder 9 and column decoder 8 according to the result of comparison. Column decoder 8 selects a column selection line CSL in the normal memory array according to the supplied predecode signal when activated while spare column decoder 9 selects a spare column selection line SCSL in spare memory array 1s when activated. Data of a selected memory cell on a memory cell column selected by spare column decoder 9 or column decoder 8, is coupled to a write/read circuit via a column selection gate and an IO bus (not shown) and accordingly, data is written/read.

Internal column address signal generating circuit 5 generates complementary column address signals CA and /CA from the external address signal according to internal clock-signal CLK. Consequently, an internal column address signal can be defined at an advanced timing. (This configuration will be described in detail below.)

Column predecoder 6 may be configured to predecode internal address signals Ain and /Ain from internal column address signal generating circuit 5 upon activation of the column address activation signal (This configuration will be described in detail later).

According to the present invention, a column selecting operation can be done at high speed by minimizing the propagation time of a signal from internal column address signal generating circuit 5 to column decoder 8 and spare column decoder 9.

Internal column address signal generating circuit 5 includes a burst address counter performing a counting operation in each clock cycle with an externally supplied address signal used as a leading address, to generate an internal column address signal. Activation signal SADE for the address signal from the burst address counter and column address activation signal CADE for activating the externally supplied address signal are separately generated to allow the internal column address signal to be driven into an active state according to the externally supplied address signal at an advanced timing. In each clock cycle, the internal column address signal can be driven into the active state at the same timing as that of a leading internal column address signal according to a burst address. Consequently, it is unnecessary to consider a time lag in definition timing between the leading address (internal column address according to external address) and the burst address in each clock cycle, so that the column selecting operation can be done more speedily.

Column predecoder 6 directly receives the internal address signal from internal column address signal generating circuit 5, so that the predecode signal can be driven into the definite state at an advanced timing.

Spare determination circuit 7 is configured to perform its determining operation more quickly to enable the column selecting operation in each clock cycle to be done more speedily. The structure of each circuit portion is hereinafter described in detail.

Figure 2:
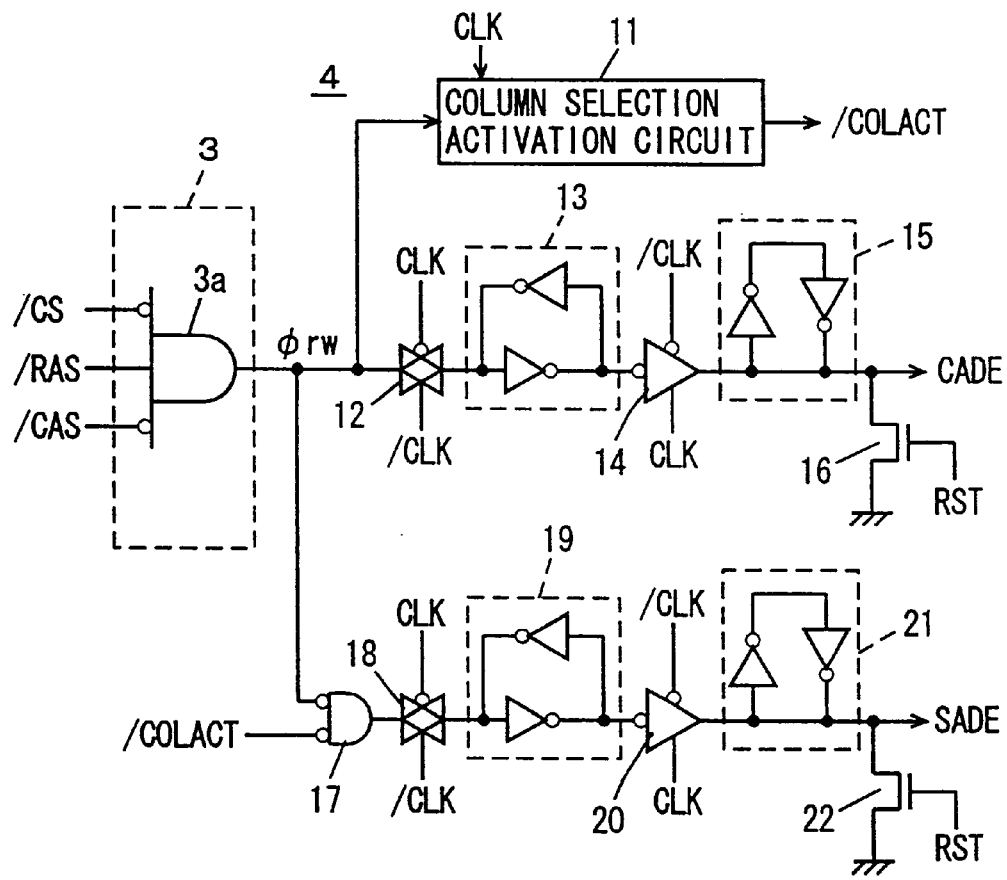
FIG. 2 illustrates structures of a command decoder and a control circuit of the synchronous semiconductor memory device shown in FIG. 1.

First Embodiment
Generation of Address Activation Signal:

FIG. 2 illustrates the structures of command decoder 3 and control circuit 4 shown in FIG. 1. Referring to FIG. 2, command decoder 3 includes an access command decode circuit 3a which receives externally supplied command, i.e., chip select signal /CS, row address strobe signal /RAS and column address strobe signal /CAS. When chip select signal /CS and column address strobe signal /CAS are at L level, and row address strobe signal /RAS is at H level, reading or writing is designated in accordance with the state of write enable signal /WE. In writing and reading data, the column selecting operation is performed. Therefore, whether or not the data access to a memory cell or the column selection is performed can be determined by signals /CS, /RAS and /CAS. The read command and the write command are collectively referred to as access command. Access command decode circuit 3a chives column selecting operation instruction signal φrw to H level of the active state when a supplied command is the access command.

Control circuit 4 includes a column selection activation circuit 11 which takes column selecting operation instruction signal φrw from command decoder 3 synchronously with rising of internal clock signal CLK, and outputs a column selecting operation activation signal COLACT which is held at L level of the active state during a prescribed period (burst length). A circuit portion related to the column selection is activated according to column selecting operation activation signal COLACT.

Control circuit 4 further includes a CMOS transmission gate 12 which is rendered non-conductive in synchronization with rising of internal clock signal CLK and takes in the column selecting operation instruction signal, rw an inverter latch 13 which inverts and latches a signal supplied from CMOS transmission gate 12, a tristate inverter buffer 14 which is set into an operable state synchronously with rising of internal clock signal CLK, inverts the signal held by inverter latch 13 and outputs column address activation signal CADE, and an inverter latch 15 which holds column address activation signal CADE output from tristate inverter buffer 14.

Inverter latch 13 is constituted of inverters having their inputs and outputs cross-coupled to each other, and inverter latch 15 includes inverters connected to the output node of tristate inverter buffer 14 in a looped manner. Inverter latch 13 transmits a signal from CMOS transmission gate 12 and latches it with a relatively large latching capability. Inverter latch 15 has a configuration of so-called "half latch," and has a latching capability weakened to allow a reset transistor 16 to easily reset column address activation signal CADE.

Control circuit 4 further includes an NOR circuit 17 which receives column selecting operation instruction signal φrw from access command decode circuit 3a and column selecting operation activation signal /COLACT from column selection activation circuit 11, a CMOS transmission gate 18 which is rendered conductive when internal clock signal CLK is at L level, to pass a signal output from NOR circuit 17, an inverter latch 19 which latches and inverts a signal output from CMOS transmission gate 18, a tristate inverter buffer 20 which is set into an operable state when internal clock signal CLK is at H level, to invert a signal from inverter latch 19 for outputting counter address activation signal SADE, an inverter latch 21 which latches counter address activation signal SADE from tristate inverter buffer 20, and a reset transistor 22 which resets counter address activation signal SADE to L level in response to reset signal RST.

Inverter latches 19 and 21 have configurations similar to those of inverter latches 13 and 15 respectively. NOR circuit 17 outputs a signal of L level in a clock cycle in which an access command is supplied and column selecting operation instruction signal φrw is driven into the active state. Accordingly, in the cycle in which the access command is supplied, counter address activation signal SADE maintains an inactive state. From the following clock cycle, counter address activation signal SADE is driven into H level and then reset to L level in each clock cycle during a period in which column selecting operation activation signal, COLACT is at L level of the active state. At this time, column address activation signal CADE is maintained at L level. Two address activation signals CADE and SADE are generated. Reset signal RST is activated in each clock cycle during the burst length period.

Figure 3:
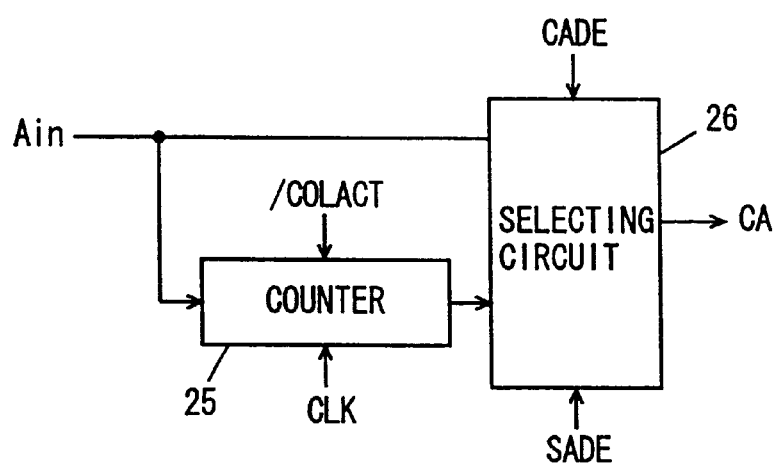
FIG. 3 is a schematic diagram illustrating a structure of an internal column address signal generating circuit shown in FIG. 1.

FIG. 3 is a schematic diagram illustrating a main portion of internal column address signal generating circuit 5 shown in FIG. 1. Referring to FIG. 3, internal column address signal generating circuit 5 includes a counter 25 which takes internal address signal Ain in response to activation of column selecting operation activation signal, COLACT, to perform a counting operation synchronously with falling of internal clock signal CLK, and a selecting circuit 26 which selects one of internal address signal Ain and an output count of counter 25 according to column address activation signal CADE and counter address activation signal SADE to output internal column address signal CA. Selecting circuit 26 selects internal address signal Ain when column address activation signal CADE is in the active state, and selects an output count of counter 25 when counter address activation signal SADE is in the active state. The timing of generating the internal address signal is hereinbelow described in detail.

Figure 4:
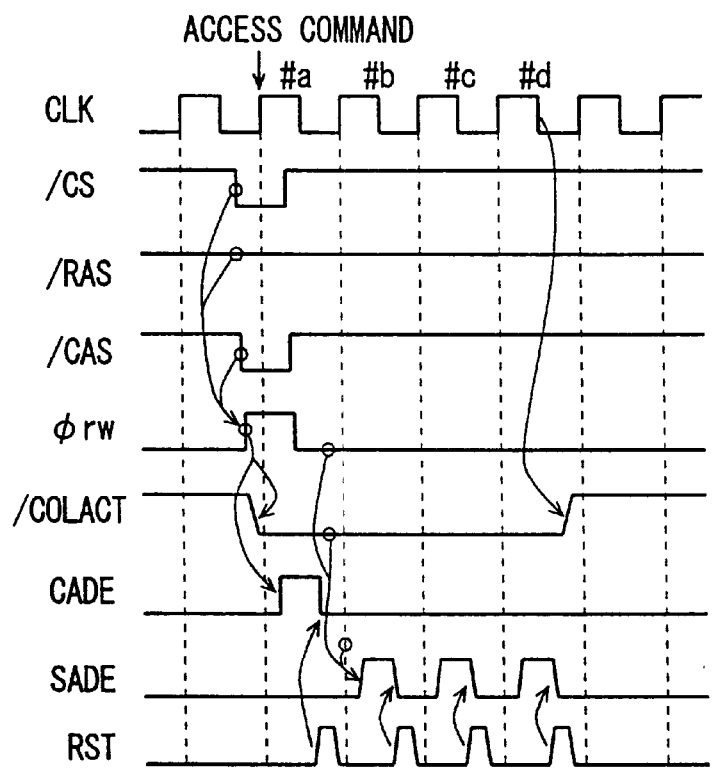
FIG. 4 is a timing chart representing an operation of the circuits illustrated in FIGS. 2 and 3.

Operations of the circuits shown in FIGS. 2 and 3 are described referring to the timing chart shown in FIG. 4.

In clock cycle #a, an access command is supplied. According to the access command, chip select signal /CS and column address strobe signal /CAS are set at L level and row address strobe signal /RAS is set at H level at a rising edge of internal clock signal CLK. The command has a set up time for internal clock signal (external clock signal).

Therefore, chip select signal /CS and column address strobe signal /CAS are set at L level at a timing preceding the rising edge of internal clock signal CLK.

Under this condition, column selecting operation instruction signal φrw from access command decode circuit 3a shown in FIG. 2 is driven into the active state at the time when the access command is supplied independently of internal clock signal CLK. CMOS transmission gate 12 is in the conductive state when internal clock signal CLK is at L level, and accordingly passes column selecting operation instruction signal φrw to supply it to inverter latch 13. When internal clock signal CLK attains H level and CMOS transmission gate 12 is set into the non-conductive state, column selecting operation instruction signal φrw in the active state has already been latched by inverter latch 13. When internal clock signal CLK attains H level, tristate inverter buffer 14 operates to invert the signal latched by inverter latch 13 and output an inverted version of the latched signal. Accordingly, after internal clock signal CLK rises, column address activation signal CADE is driven into H level at an advanced timing.

In the cycle preceding clock cycle #a, when CMOS transmission gate 18 is in the conductive state (internal clock signal CLK is at L level), column selecting operation instruction signal φrw is at H level and an output signal of NOR circuit 17 is at L level. When internal clock signal CLK attains H level and CMOS transmission gate 18 is set into the non-conductive state, inverter latch 19 latches a signal of H level and supplies it to tristate inverter buffer 20. Even if internal clock signal CLK rises, counter address activation signal SADE maintains the L level.

In clock cycle #a, selecting circuit 26 selects internal address signal Ain and generates internal column address signal CA.

Column selection activation circuit 11 takes column selecting operation instruction signal φrw synchronously with rising of internal clock signal CLK, and maintains column selecting operation activation signal /COLACT at L level for a prescribed period. Consequently, column selecting operation activation signal /COLACT is maintained at L level in a prescribed period (burst length period) from clock cycle #a (FIG. 4 illustrates an operation for the burst length of 4). After the prescribed period passes, column address activation signal CADE is reset to L level by reset signal RST.

In clock cycle #b, chip select signal /CS is maintained at H level to process the supplied command as an NOP (No Operation) command. In this state, when CMOS transmission gate 12 is rendered conductive, column selecting operation instruction signal φrw is at L level, and column address activation signal CADE maintains L level.

When signals φrw and /COLACT are both at L level, NOR circuit 17 outputs a signal at H level. In clock cycle #b, when internal clock signal CLK rises to H level, a signal of L level is already transmitted to tristate inverter buffer 20 via CMOS transmission gate 18. When internal clock signal CLK rises to H level, tristate inverter buffer 20 operates to drive counter address activation signal SADE to H level according to the signal latched by inverter latch 19. Accordingly, in clock cycle #b, selecting circuit 26 selects a count value from counter 25 to generate internal column address signal CA.

Counter 25 takes internal address signal Ain as an initial value synchronously with rising of column selecting operation activation signal /COLACT or in response to activation of column selecting operation instruction signal φrw, and performs the counting operation synchronously with falling of internal clock signal CLK during the period in which column selecting operation activation signal /COLACT is in the active state. The count value from counter 25 changes in a prescribed sequence in the burst length period. In the following clock cycles #c and #d, selecting circuit 26 selects the count value from counter 25 to generate column address signal CA according to activation of counter address activation signal SADE.

After the burst length period passes, column selecting operation activation signal /COLACT from column selection activation circuit 11 rises to H level. Accordingly, an output signal of NOR circuit 17 falls to L level, and counter address activation signal SADE maintains L level even if internal clock signal CLK rises.

As shown in FIG. 2, a command is received to be decoded for generating an internal operation instruction signal independently of internal clock signal CLK, and the signal is latched synchronously with rising of the internal clock signal for generating the internal operation instruction signal or internal operation activation signal. Accordingly, column address activation signal CADE and counter address activation signal SADE can be driven into the active state at the advanced timing, compared with the configuration in which the decoding operation is started synchronously with rising of internal clock signal CLK. Consequently, internal address signal CA can be driven into a definite state at an advanced timing.

Further, column address activation signal CADE for selecting internal address signal Ain and counter address activation signal SADE for selecting an address signal from counter 25 are separately generated. As a result, the column address signal can be made definite at an advanced timing, compared with the configuration in which internal address signal Ain is set in the counter and column address signal CA is generated through the counter.

Figure 5:
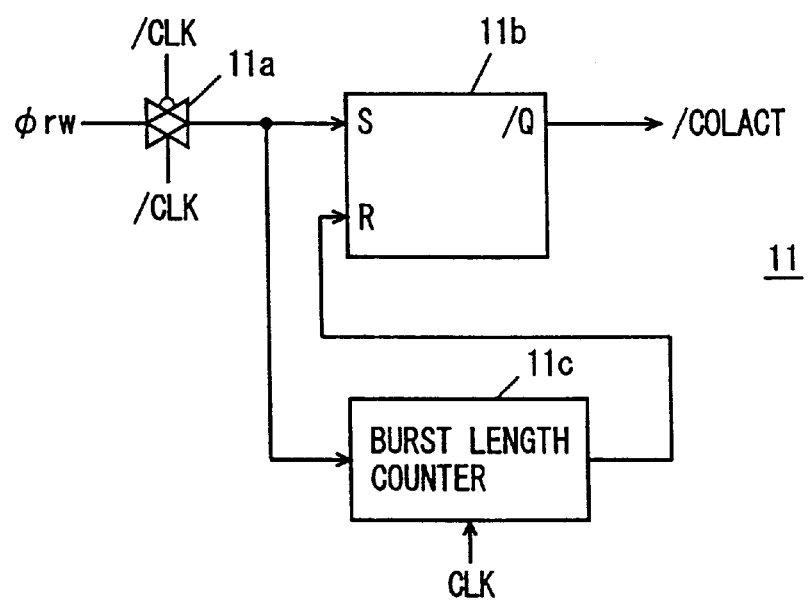
FIG. 5 is a schematic diagram showing a structure of the portion for generating a column selecting operation activation signal shown in FIG. 2.

FIG. 5 is a schematic diagram illustrating one example of the structure of column selection activation circuit 11 shown in FIG. 2. Referring to FIG. 5, column selection activation circuit 11 includes a CMOS transmission gate 11a which passes column selecting operation instruction signal φrw from access command decode circuit 3a when internal clock signal CLK is at L level, a set/reset flip-flop 11b which is set in response to rising of an output signal of CMOS transmission gate 11a, and a burst length counter 11c which is started up in response to rising of the output signal of CMOS transmission gate 11a, to count the falling of internal clock signal CLK, and outputs a count up signal when the count value reaches a prescribed value to reset set/reset flip-flop 11b. Column selecting operation activation signal /COLACT is output from an output /Q of set/reset flip-flop 11b. Burst length counter 11c is constituted of a shift register which takes a supplied signal in response to rising of internal clock signal CLK, and outputs the taken signal in response to failing of internal clock signal CLK. Burst length counter 11c is constituted by serially connecting the shift registers equal in number to the burst length.

Counter 25 shown in FIG. 3 is constituted of a counter which can be preset.

Figure 6:
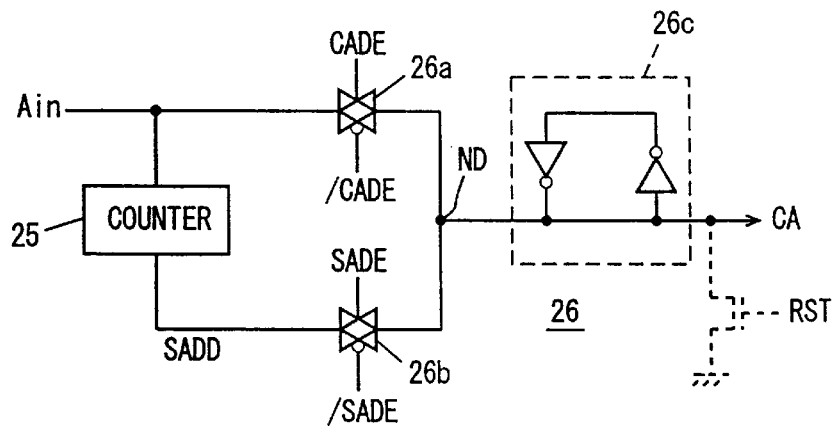
FIG. 6 illustrates a structure of a selecting circuit shown in FIG. 3.

FIG. 6 illustrates one example of a structure of selecting circuit 26 shown in FIG. 3.

Referring to FIG. 6, selecting circuit 26 includes a CMOS transmission gate 26a which is rendered conductive when column address activation signal CADE is activated to pass internal address signal Ain, a CMOS transmission gate 26b which is rendered conductive when counter address activation signal SADE is activated to pass count value SADD from counter 25, and a latch circuit 26c which latches a signal selected by CMOS transmission gates 26a and 26b. In the structure shown in FIG. 6, internal address signal Ain and count value SADD from counter 25 CA can be selected to generate internal column address signal with a simple circuit configuration, through the arrangement of connecting CMOS transmission gates 26a and 26b commonly to a node ND and generating internal column address signal CA from node ND. Internal column address signal CA is reset to L level by a resetting n channel MOS transistor which is rendered conductive in response to reset signal RST. One-shot pulsization of internal column address signal CA enables the column selecting operation to be performed at a high speed as described later.

Figure 7:
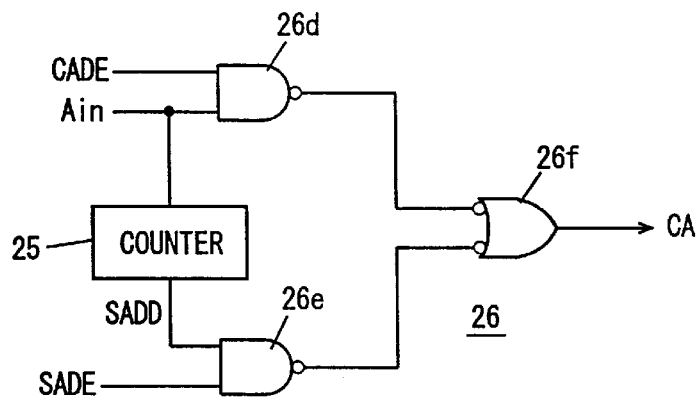
FIG. 7 illustrates another structure of the selecting circuit shown in FIG. 3.

FIG. 7 illustrates another structure of selecting circuit 26 shown in FIG. 3. Referring to FIG. 7, selecting circuit 26 includes an NAND circuit 26d which receives column address activation signal CADE and internal address signal Ain, an NAND circuit 26e which receives counter address activation signal SADE and output count SADD of counter 25, and an NAND circuit 26f which receives output signals of NAND circuits 26d and 26e for generating internal column address signal CA. Internal address signal Ain and output count SADD of counter 25 are both constituted of multiple bits, and these NAND circuits 26d, 26e and 26f are provided corresponding to respective bits.

When column address activation signal CADE is activated, counter address activation signal SADE is at L level of the inactive state. Accordingly, NAND circuit 26d operates as an inverter and NAND circuit 26e outputs a signal at H level regardless of the output count value of counter 25. NAND circuit 26f accordingly operates as an inverter to invert a signal output from NAND circuit 26d. When column address activation signal CADE is activated, internal column address signal CA is generated according to internal address signal Ain.

On the other hand, when column address activation signal CADE is at L level and counter address activation signal SADE is at H level of the active state, an output signal of NAND circuit 26d is fixed at H level, NAND circuits 26e and 26f operate as the inverters, and internal column address signal CA is generated according to count SADD from counter 25.

In the case of the structure shown in FIG. 7, when activation signals of CADE and SADE are at L level, an output signal of NAND circuit 26f or internal column address signal CA is set to L level, so that the internal column address signal can be reset into the standby state in each clock cycle and accordingly an extra reset circuit is not necessary.

Figure 8A:
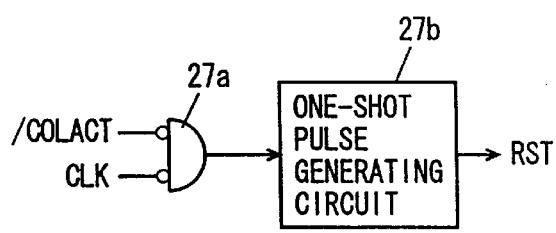
FIG. 8A illustrates a structure of a circuit for generating a reset signal shown in FIG. 2.
Figure 8B:
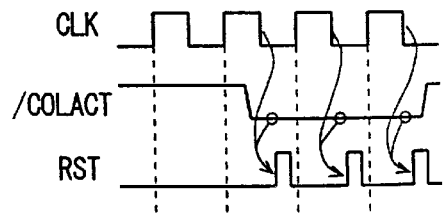
FIG. 8B is a timing chart representing an operation of the circuit shown in FIG. 8A.

FIG. 8A illustrates one example of a structure of the portion for generating reset signal RST shown in FIG. 2. Referring to FIG. 8A, a reset signal generating portion includes an NOR circuit 27a which receives column selecting operation activation signal /COLACT and internal clock signal CLK, and a one-shot pulse generating circuit 27b which generates a one shot-pulse signal in response to rising of an output signal of NOR circuit 27a. The one-shot pulse signal from one-shot pulse generating circuit 27b is used as reset signal RST. An operation of the reset signal generating portion shown in FIG. 8A is hereinbelow described with reference to the timing chart shown in FIG. 8B.

When column selecting operation activation signal /COLACT is at H level, the output signal of NOR circuit 27a is fixed at L level and reset signal RST from one-shot pulse generating circuit 27b is maintained at L level. When column selecting operation activation signal /COLACT is driven to the active state of L level, the output signal of NOR circuit 27a attains H level in response to falling of internal clock signal CLK. One-shot pulse generating circuit 27b generates a one-shot pulse signal in response to rising of the output signal of NOR circuit 27a to activate reset signal RST. Accordingly, reset transistors 16 and 22 shown in FIG. 2 and the reset transistor indicated by the broken line in FIG. 6 are rendered conductive, and address activation signals CADE and SADE and column address signal CA shown in FIG. 6 are reset to L level of the initial state. During the period in which column selecting operation activation signal /COLACT is in the active state of L level, reset signal RST is activated in response to falling of internal clock signal CLK. In each clock cycle, address activation signals CADE and SADE and column address CA can be reset to L level, so that it is possible to prevent generation of an internal column address signal according to an unstable internal address signal when internal address signal Ain or count SADE from counter 25 changes, and thus the internal column address can be stably generated.

Modification 1

Figure 9:
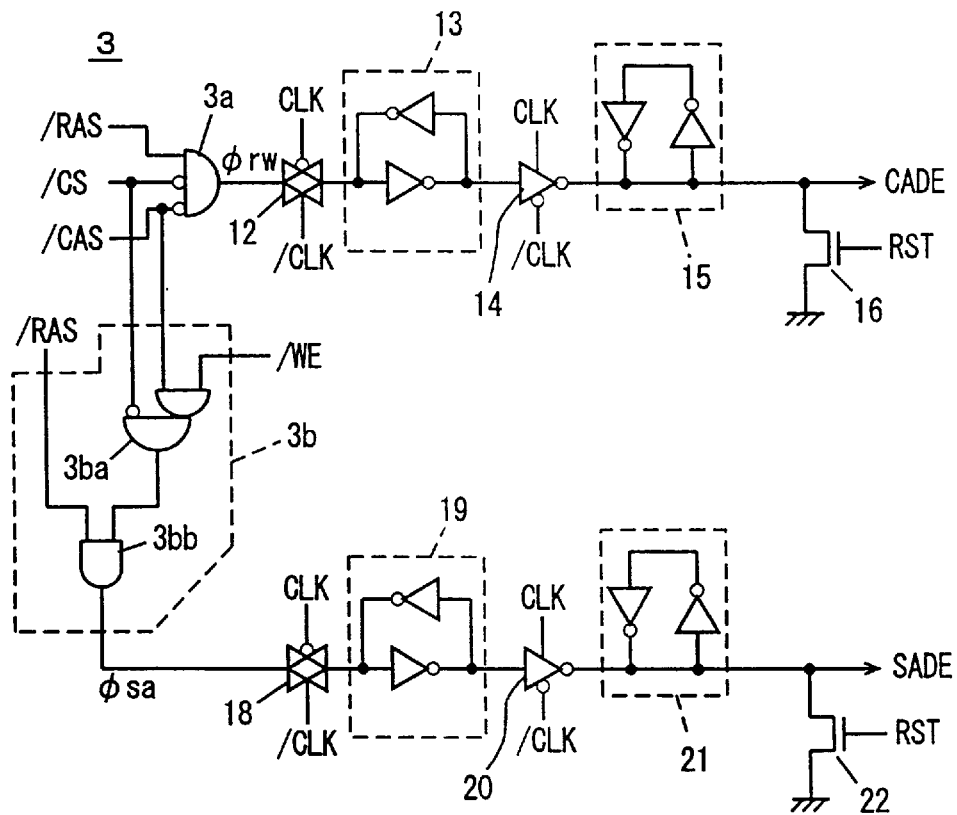
FIG. 9 illustrates a modification of the circuit shown in FIG. 2.

FIG. 9 illustrates a structure of a modification of the first embodiment of the present invention. In the structure illustrated in FIG. 9, a command for generating an internal column address signal according to an externally supplied address signal and a command utilizing a count value from the counter as a column address signal are separately provided. Therefore, a command decoder 3 includes an access command decode circuit 3a which generates a signal for instructing an access operation to write/read data and a counter address access command decode circuit 3b which outputs a signal φsa for instructing to utilize the count (counter address) of the counter as a column address. Access command decode circuit 3a which decodes a normal access command and the circuit portion which generates column address activation signal CADE according to column selecting operation instruction signal φrw from access command decode circuit 3a are similar to those circuit portions illustrated in FIG. 2. Therefore, corresponding components have the same reference characters and description thereof is omitted.

Counter address access command decode circuit 3b includes a composite gate 3ba which receives chip select signal /CS, column address strobe signal /CAS and write enable signal /WE, and an AND circuit 3bb which receives an output signal of composite gate 3ba and row address strobe signal /RAS. Composite gate 3ba is equivalent to a structure including an AND circuit which receives column address strobe signal /CAS and write enable signal /WE and a gate circuit which receives an output signal from the AND circuit and chip select signal /CS. The gate circuit sets the output signal at H level when chip select signal /CS is at L level and the output signal of the AND circuit is at H level. Accordingly, composite gate 3ba outputs a signal of H level when chip select signal /CS is at L level and column address strobe signal /CAS and write enable signal /WE are both at H level.

AND circuit 3bb drives a count address validation instruction signal φsa into the active state when an output signal of composite gate 3ba and row address strobe signal /RAS are both at H level. When chip select signal /CS is at L level and other signals /RAS, /CAS and AWE are all at H level, signal 0sa is driven into H level. Signal φsa is transmitted via CMOS transmission gate 18 which is set into the non-conductive state in synchronization with rising of internal clock signal CLK.

Figure 10:
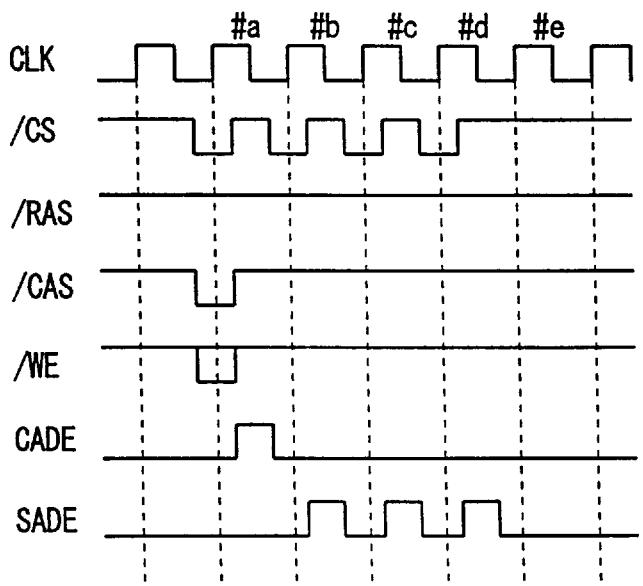
FIG. 10 is a timing chart representing an operation of the circuit shown in FIG. 9.

The circuit portion which generates counter address activation signal SADE according to signal φsa is similar to the circuit portion which generates counter address activation signal SADE according to an output signal of NOR circuit 17. Therefore, corresponding components have the same reference characters and description thereof is omitted. An operation of the circuit illustrated in FIG. 9 is now described referring to the timing chart of FIG. 10.

Before internal clock signal CLK rises in clock cycle #a, chip select signal /CS, column address strobe signal /CAS are set at L level, and write enable signal /WE is set at H level or L level according to writing/reading mode of data. In this state, a normal read command or write command is supplied. When column selecting operation instruction signal φrw from access command decoder circuit 3a rises to H level, column address activation signal CADE from tristate inverter buffer 14 rises to H level in synchronization with rising of internal clock signal CLK. On the other hand, in counter access command decode circuit 3b, column address strobe signal /CAS is at L level and an output signal of composite gate 3b is at L level. Accordingly, signal φsa is at L level and counter address activation signal SADE is also held at L level. Before internal clock signal CLK rises in clock cycle #b, chip select signal /CS is set at L level, and other signals /RAS, /CAS and /WE are set at H level. In this state, an output signal of composite gate 3ba rises to H level, and accordingly counter address validation instruction signal φsa from AND circuit 3bb attains H level. In response to rising of internal clock signal CLK, CMOS transmission gate 18 is set into the non-conductive state and tristate inverter buffer 20 operates to drive counter address activation signal SADE into the active state of H level. Therefore, chip select signal /CS is similarly driven to L level and the other signals /RAS, /CAS and /WE are maintained at H level similarly during the burst length period in which data reading is done. Consequently, count address validation instruction signal φsa is produced and counter address activation signal SADE is activated in each of clock cycles #c and #d.

In clock cycle #e, chip select signal /CS is maintained at H level to set output signals φrw and φsa of command decode circuits 3a and 3b into L level and to maintain address activation signals CADE and SADE at L level.

As illustrated in FIG. 9, a command for validating a counter address and a command for instructing a normal access operation indicating reading/writing of data are separately provided to allow data of the necessary number in the burst length to be written/read.

In the structure illustrated in FIG. 9, reset signal RST is driven into the active state for a prescribed period in synchronization with falling of internal clock signal CLK when column selecting operation activation signal /COLACT from a control portion (not shown) is activated.

Although signals φrw and φsa are driven into H level upon activation thereof, they may be driven into L level upon activation thereof. In other words, the polarity of illustrated signals may be reversed.

Modification 2

Figure 11:
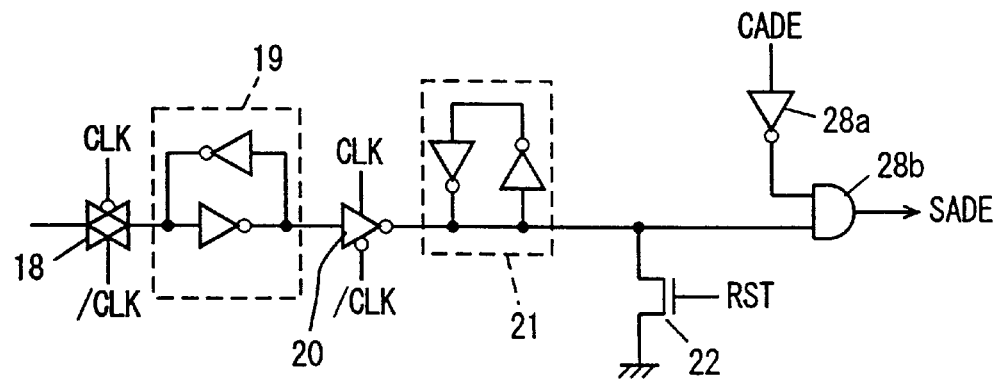
FIG. 11 is a modification of the circuits shown in FIGS. 2 and 9.

FIG. 11 illustrates a structure of Modification 2 of the first embodiment of the present invention. FIG. 11 shows a structure of the portion which generates the counter address activation signal SADE. A trigger signal for generating counter address activation signal SADE may be generated according to any of the circuit structures illustrated in FIG. 9 or FIG. 2. In the structure shown in FIG. 11, in addition to the components illustrated in FIG. 2 or FIG. 9, an inverter 28a which receives column address activation signal CADE, and an AND circuit 28b which receives an output signal of tristate inverter buffer 20 and an output signal of inverter 28a to generate counter address activation signal SADE are provided.

In the structure illustrated in FIG. 11, when column address activation signal CADE is activated, counter address activation signal SADE is forced to be reset to L level. Accordingly, when an access command is supplied and an externally supplied address signal is taken to generate an internal column address signal in the cycle in which the access command is supplied, collision of an externally supplied address signal and an erroneously simultaneously selected address signal from the counter can be prevented. In the second clock cycle and following cycles, column address activation signal CADE is set at L level, so that counter address activation signal SADE is activated according to an output signal of tristate inverter buffer 20.

According to the first embodiment of the present invention, a command related to column selection is decoded at a timing preceding the internal clock signal and an internal operation activation signal is generated according to the internal clock signal. As a result, the internal operation activation signal (address activation signal) can be driven into the active state at a high speed to start an internal operation at an advanced timing.

Further, an address signal which is externally supplied and an address signal from the counter are selected according to separate control signals respectively to generate an internal column address signal. Therefore, in each clock cycle, an internal column address signal can be generated at the same timing and it is unnecessary to consider the margin of the timing at which the internal column address signal is made definite for the column address signal from the counter address and the externally supplied address signal. Accordingly, the column selecting operation can be started at an advanced timing.

Second Embodiment

Figure 12:
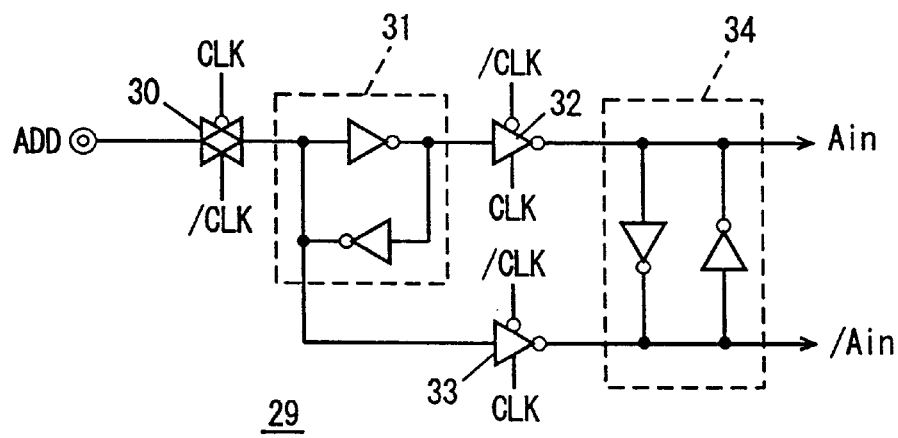
FIG. 12 illustrates a structure of a portion for generating an internal address signal of the internal column address signal generating circuit shown in FIG. 1.

Structure of Column Address Signal Generating Circuit:

FIG. 12 illustrates a structure of an address input portion included in internal column address signal generating circuit 5 shown in FIG. 1. Although the circuit structure shown in FIG. 12 is provided to each bit of a multi-bit address signal, a circuit portion corresponding to address signal ADD of one bit is shown. The address input portion latches a supplied address signal according to internal clock signal CLK to generate internal address signals Ain and /Ain.

Address input latch 29 includes a CMOS transmission gate 30 which passes address signal ADD supplied to an address input terminal when internal clock signal CLK is at L level, an inverter latch 31 which inverts the address signal passing through CMOS transmission gate 30 and latches the inverted signal, a tristate inverter buffer 32 which is enabled when internal clock signal CLK is at H level, to invert an output signal of inverter latch 31, a tristate inverter buffer 33 which is enabled when internal clock signal CLK is at H level, to invert an address signal from CMOS transmission gate 30, and an inverter latch 34 which latches the output signals from tristate inverter buffers 32 and 33. Internal address signal Ain is output from tristate inverter buffer 32, and complemental internal address signal /Ain is output from tristate inverter buffer 33. Inverter latch 34 includes inverters that are connected in anti-parallel between the outputs of tristate inverter buffers 32 and 33.

In the structure of address input latch 29 illustrated in FIG. 12, when internal clock signal CLK is at L level, CMOS transmission gate 30 passes the address signal provided to the address input node to supply it to inverter latch 31. When internal clock signal CLK rises to H level, CMOS transmission gate 30 is in the non-conductive state and the address input latch is in a latching state. In response to rising of internal clock signal CLK, tristate inverter buffers 32 and 33 are enabled to invert output and input signals of inverter latch 31 respectively to generate complementary internal address signals Ain and /Ain. These internal address signals Ain and /Ain are latched by inverter latch 34.

As illustrated in FIG. 12, the complementary internal address signals are generated to be latched in address input latch 29 with internal clock signal CLK used as trigger, so that the internal column address signal is defined at an earlier stage. Further, the circuit structure of the column address generating portion can be simplified.

Figure 13:
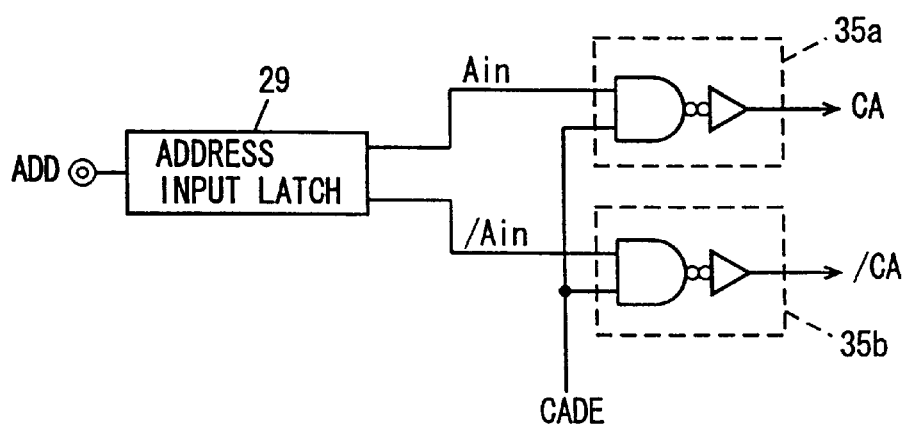
FIG. 13 is a schematic diagram illustrating a structure of the internal column address signal generating circuit shown in FIG. 1.

FIG. 13 illustrates a structure of the column address signal generating portion. Referring to FIG. 13, the column address signal generating portion includes an AND circuit 35a which passes internal address signal Ain from address input latch 29 in response to column address activation signal CADE, to generate internal column address signal CA, and an AND circuit 35b which passes complemental internal address signal /Ain from address input latch 29 when column address activation signal CADE is activated, to generate complementary internal column address signal /CA. According to column address activation signal CADE, complementary internal address signals Ain and /Ain from address input latch 29 are gated to generate internal column address signals CA and /CA. Accordingly, the structure of the internal column address signal generating portion can be simplified as that of the structure illustrated in FIG. 3, and the internal column address signals CA and /CA can be made definite at the same timing. AND circuits 35a and 35b are simply provided in the arrangement of the internal column address signal generating portion shown in FIG. 13, and internal column address signals CA and /CA are not latched, offering advantages as discussed below.

Figure 14:
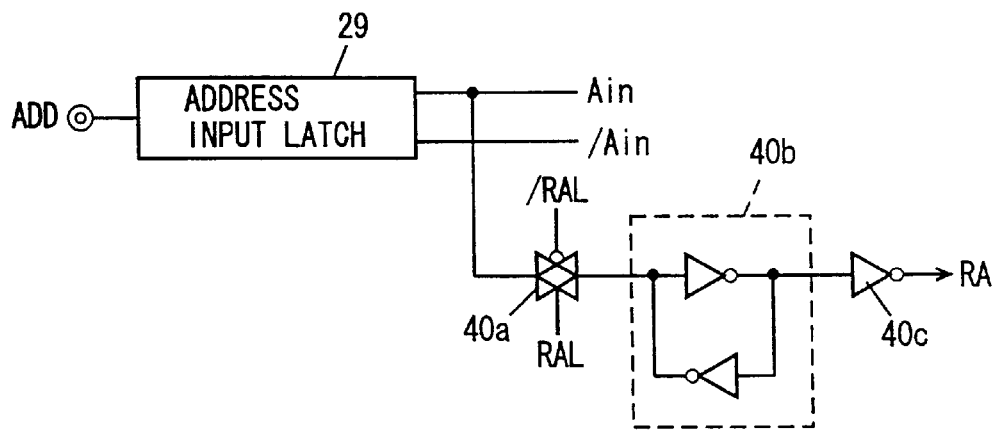
FIG. 14 shows a structure of an internal row address signal generating portion for illustrating an effect of the circuit shown in FIG. 13.

FIG. 14 is a schematic diagram illustrating a structure of an internal row address signal generating portion. Referring to FIG. 14, the internal row address signal generating portion includes a CMOS transmission gate 40a which passes internal address signal Ain from address input latch 29 when row address latch enable signal RAL is activated, an inverter latch 40b which inverts and latches an output signal of CMOS transmission gate 40a, and an inverter 40c which inverts an output signal of inverter latch 40b. Complementary internal row address signals are generated from internal row address signal RA according to row address activation signal RADE.

Figure 15:
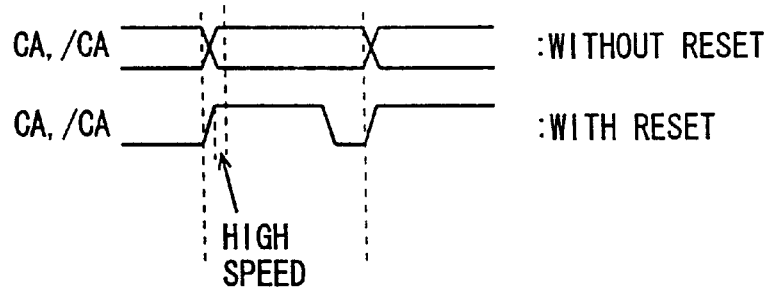
FIG. 15 shows signal waveforms illustrating an operation of the circuit shown in FIG. 13.

In the structure of the row address signal generating portion illustrated for comparison in FIG. 14, internal row address signal RA is latched and is not reset. If the internal column address signal is also latched as the row address signal is done, the states of internal column address signals CA and /CA change from the states in the preceding cycle in synchronization with rising of internal clock signal CLK as shown in FIG. 15, and the latched state should be reversed, so that it takes much time for the signal states to be made definite. If the complementary internal column address signals are generated according to column address activation signal CADE merely using the AND circuits as illustrated in FIG. 13, the signal potential changes from the reset state and the latched state need not be reversed. It is only necessary to consider the gate delay in AND circuits 35a and 35b, and accordingly internal column address signals CA and /CA can be driven into the definite state at a high speed as shown in FIG. 15. As a result, the internal column address signal can be made definite at an advanced timing and the internal column selecting operation can be started at an advanced timing.

Further, the circuit for latching the column address signal is not required and the circuit structure of the internal column address signal generating portion can be simplified. It is also unnecessary to generate column address latch instruction signal CAL corresponding to row address latch instruction signal RAL for the row address signal, and consequently the complementary internal address signals can be generated in synchronization with the internal clock signal and the internal column address signal can be generated by column address activation signal CADE. By activating column address activation signal CADE at a fast timing after internal clock signal CLK rises, the internal column address signal can be set into the definite state at a fast timing (since the gate responsive to signal CAL is unnecessary).

Address input latch 29 may be configured to allow complementary signals Ain and /Ain to be reset using reset signal RST according to the first embodiment. As internal column address signals CA and /CA, one of the column address signals from AND circuits 35a and 35b and the counter address from the counter is alternatively selected in combination with counter address activation signal SADE for selecting an address from the counter according to the first embodiment. A selecting circuit which receives internal column address signals CA and /CA will be provided to the structure shown in FIG. 13.

Modification

Figure 16:
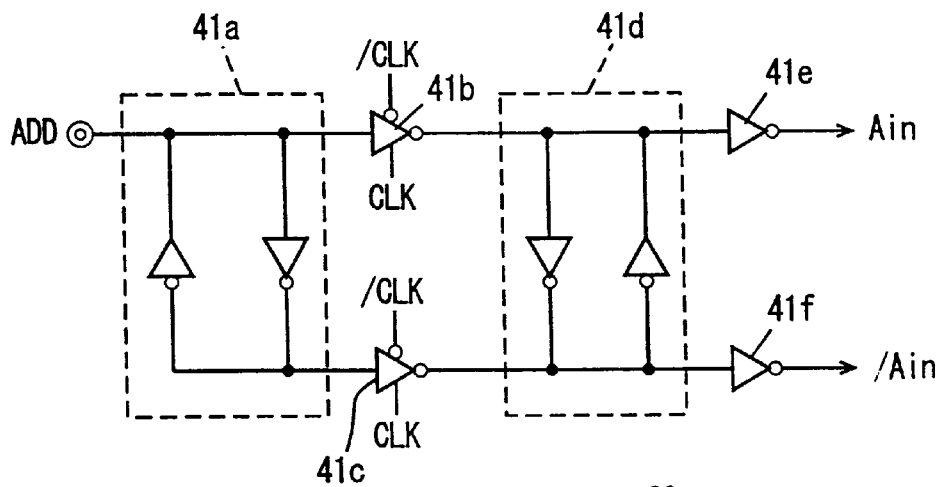
FIG. 16 is a modification of the internal address signal generating portion shown in FIG. 12.

FIG. 16 illustrates a structure of a modification of the second embodiment of the present invention. Referring to FIG. 16, an address input latch 29 includes an inverter latch 41a which latches an address signal supplied to an address input node, a tristate inverter buffer 41b which operates when internal clock signal CLK attains H level, to invert address signal ADD provided to the address input node, a tristate inverter buffer 41c which receives an inverted version of address signal ADD from inverter latch 41a, and operates when internal clock signal CLK attains H level to invert the inverted address signal from inverter latch 41a, an inverter latch 41d which latches output signals from tristate inverter buffers 41b and 41c, an inverter 41e which inverts an output signal of tristate inverter buffer 41b to generate internal address signal Ain, and an inverter 41f which inverts an output signal of tristate inverter buffer 41c to generate a complementary internal address signal /Ain. Inverter latch 41a includes inverters connected in anti-parallel to each other between the inputs of tristate inverter buffers 41b and 41c. Inverter latch 41d includes inverters connected in anti-parallel between the outputs of tristate inverter buffers 41b and 41c.

In the address input latch illustrated in FIG. 16, the delay times on the paths transmitting complementary internal address signals Ain and /Ain are the same with each other from the time at which internal clock signal CLK rises. Therefore, after internal clock signal CLK rises, address signals Ain and /Ain can be set into the definite state at the same timing. Accordingly, the internal address signal can be set into the definite state at an advanced timing. The internal column address signal can be made definite at a fast timing.

According to the second embodiment, the external address signal is latched in synchronization with the internal clock signal to generate the complementary internal address signals. As a result, the structure of the address latch circuit can be simplified. Further, the internal column address signals are generated from the complementary internal address signals by the logical product with the column address activation signal, simplifying the circuit structure. Further, the internal column address signal can be set into the definite state at a fast timing.

The internal column address signal is reset to the initial state in each clock cycle, so that only one of complementary internal column address signals is charged in the clock cycle, accordingly the current flows only in one direction. The current flowing from the power supply to the ground is reduced compared with the state in which both signals change due to the influence of the address signal in the preceding cycle.

The signal changes in one direction from the voltage level at the same reset state without influence by the column address signal in the preceding clock cycle. Therefore, the internal column address signal can be driven into the definite state at the same timing without the influence of the voltage level of the column address signal in the preceding clock cycle, and accordingly the internal column address signal can be set into the definite state at a fast timing.

Third Embodiment

Figure 17:
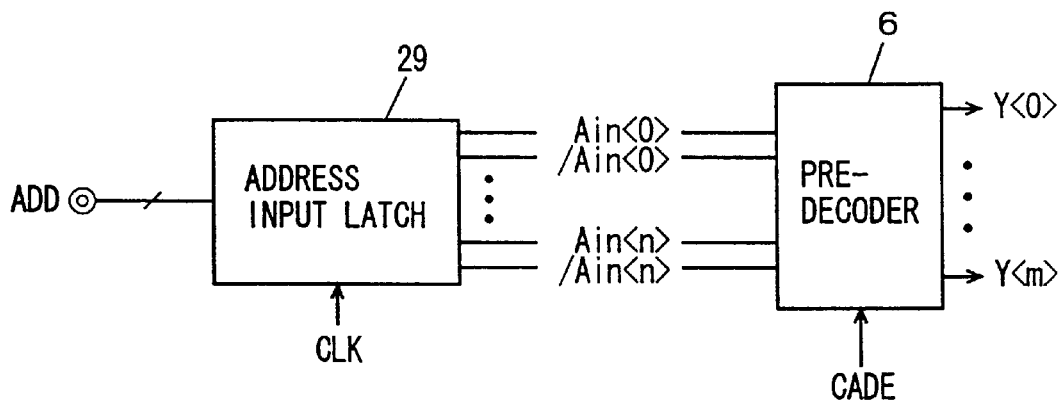
FIG. 17 is a schematic diagram illustrating a structure of a column predecoder shown in FIG. 1.

FIG. 17 illustrates a structure of a main portion of a semiconductor memory device according to the third embodiment of the present invention. Referring to FIG. 17, predecoder 6 shown in FIG. 1 is enabled in response to activation of column address activation signal CADE to predecode internal address signal bits Ain<0>, /Ain<0>–Ain<n>, and /Ain<n> and generate predecode signals Y<0>–Y<m>. Predecoder 6 performs the predecoding operation according to activation of column address activation signal CADE when complementary internal address signals are generated, and the predecoding operation is not performed after internal column address signals CA and ICA are made definite. When internal clock signal CLK rises, internal address signals Ain<0>, /Ain<0>–Ain<n>, and /Ain<n> from address input latch 29 are predecoded, so that predecode signals Y<0>Y<m> can be made definite at a fast timing.

Figure 18:
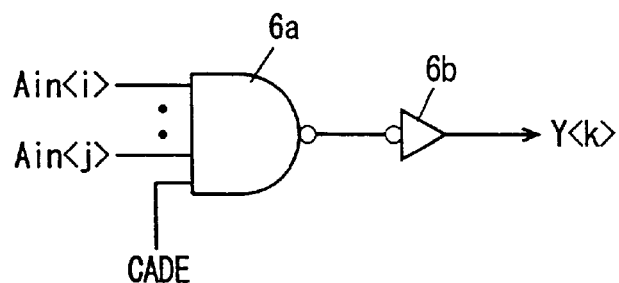
FIG. 18 specifically shows a structure of the predecoder shown in FIG. 17.
Figure 19:
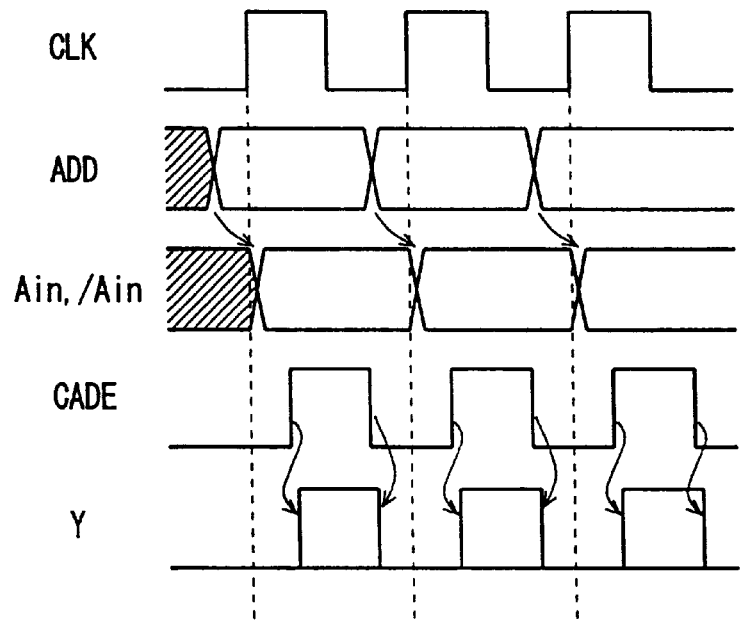
FIG. 19 is a timing chart representing an operation of the predecoder shown in FIG. 17.

FIG. 18 illustrates a structure of a predecode circuit included in predecoder 6 illustrated in FIG. 17. FIG. 18 show a predecode circuit for prededode signal Y<k>. The predecode circuit includes an NAND circuit 6a which receives a prescribed set of internal address signals, Ain<i>, . . . Ain<j> from address input latch 29, and column address activation signal CADE, and an inverter 6b which inverts an output signal of NAND circuit 6a to generate predecode signal Y<k>. Referring now to FIG. 19, an operation of predecoder 6 illustrated in FIGS. 17 and 18 is described.

When column address activation signal CADE is at L level of the inactive state, an output signal of NAND 6a is at H level and predecode signal Y<k> maintains a non-selected state of L level. When column address activation signal CADE is activated, an output signal of NAND circuit 6a is made definite by a combination of supplied internal address signals Ain<i>, . . . Ain<j> (including a complemental address signal), and the state of predecode signal Y<k> is made definite according to the combination. Address input latch 29 is commonly provided to a row address signal and a column address signal, and whether the address signal is a row address signal or a column address signal is determined according to column address activation signal CADE. The predecoding operation is done simultaneously with determination of the column address signal, so that the predecode signal can be set into the definite state at a faster timing to speedily perform the column selecting operation.

When column address activation signal CADE is inactivated, predecoder 6 is disabled and predecode signals Y<0>–Y<m> are reset to L level (initialized). Consequently, the valid period of the predecode signals is determined, and the predecode signals always change from L level, so that the predecode signals always change at the same timing to reach the definite state without influence by the state of the predecode signal in the preceding cycle. Therefore, the margin for the timing at which the predecode signal is made definite (margin determined by considering the speed of change from the predecode signal in the preceding cycle) need not be considered and the predecode signal is set into the definite state at an advanced timing to perform the column selecting operation.

In the arrangement of address input latch 29 and predecoder 6 illustrated in FIG. 17, any of the structures of the address input latch according to the second embodiment may be employed as the structure of address input latch 29.

In each clock cycle, column address activation signal CADE is activated. However, if an address signal from a burst address counter is used, counter address activation signal SADE is used in place of column address activation signal CADE. In this case, a signal generated by ORing column address activation signal CADE and counter address activation signal SADE can be used for activating the predecoder. In this case, a structure for switching internal address signal Ain and counter address SAin from the counter is necessary.

Modification

Figure 20:
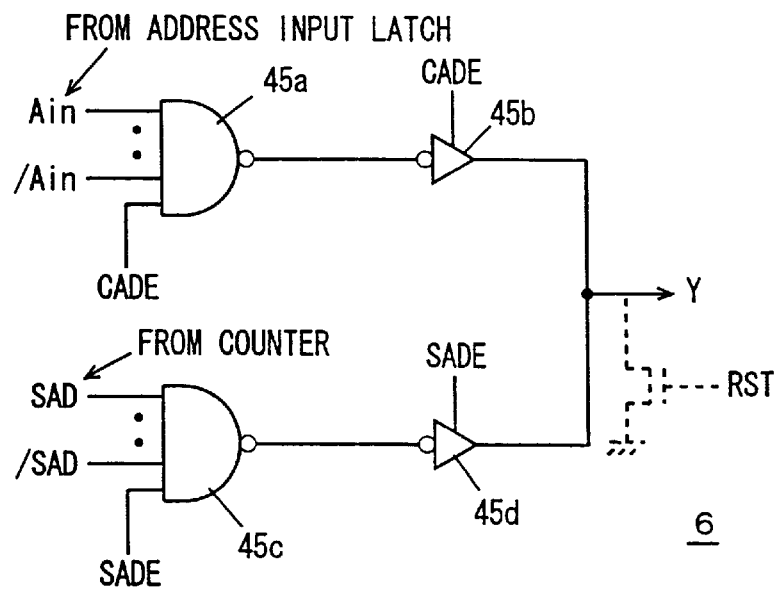
FIG. 20 is a schematic diagram of a modification of the predecoder shown in FIG. 17

FIG. 20 illustrates a structure of a modification according to the third embodiment of the present invention. Referring to FIG. 20, a predecoder 6 includes an NAND type decode circuit 45a receiving complementary internal address signals Ain and /Ain supplied from an address input latch and predecoding supplied complementary internal address signals Ain and /Ain in response to activation of column address activation signal CADE, a tristate inverter buffer 45b set into an operable state in response to activation of column address activation signal CADE to invert an output signal of NAND type decode circuit 45a, an NAND type decode circuit 45c receiving count address signals SAD and /SAD from the counter, and predecoding counter addresses SAD and /SAD in response to activation of counter address activation signal SADE, and a tristate inverter buffer 45d set into an operable state in response to activation of counter address activation signal SADE, to invert an output signal of NAND type decode circuit 45c. The outputs of tristate inverter buffers 45b and 45d are commonly coupled to generate predecode signal Y.

Even with the structure of the predecoder illustrated in FIG. 20, addresses SAD and /SAD from the counter are predecoded simultaneously with activation of counter address activation signal SADE under a burst mode operation, so that predecode signal Y can be generated at a fast timing. The illustrated structure needs a reset MOS transistor for resetting predecode signal Y in response to reset signal RST as shown by dotted lines.

According to the third embodiment, an internal address signal from the address input latch which takes an external address signal according to an internal clock signal to generate the internal address signal, is predecoded in response to activation of a column address activation signal. Therefore, the column address generating portion and the predecoder can be commonly used and the number of stages of the gates in the propagation path of the column address signal is reduced. Consequently, the predecode signal can be driven at a high speed.

The predecode signal is reset to the initial state (standby state) in each clock cycle, so that the predecode signal can be set into the definite state at a fast timing in each clock cycle and accordingly, the column selecting operation can be started at an advanced timing.

According to the first to the third embodiments described above, the standby state of each signal is set at L level. However, the reset state may be at H level.

Figure 21:
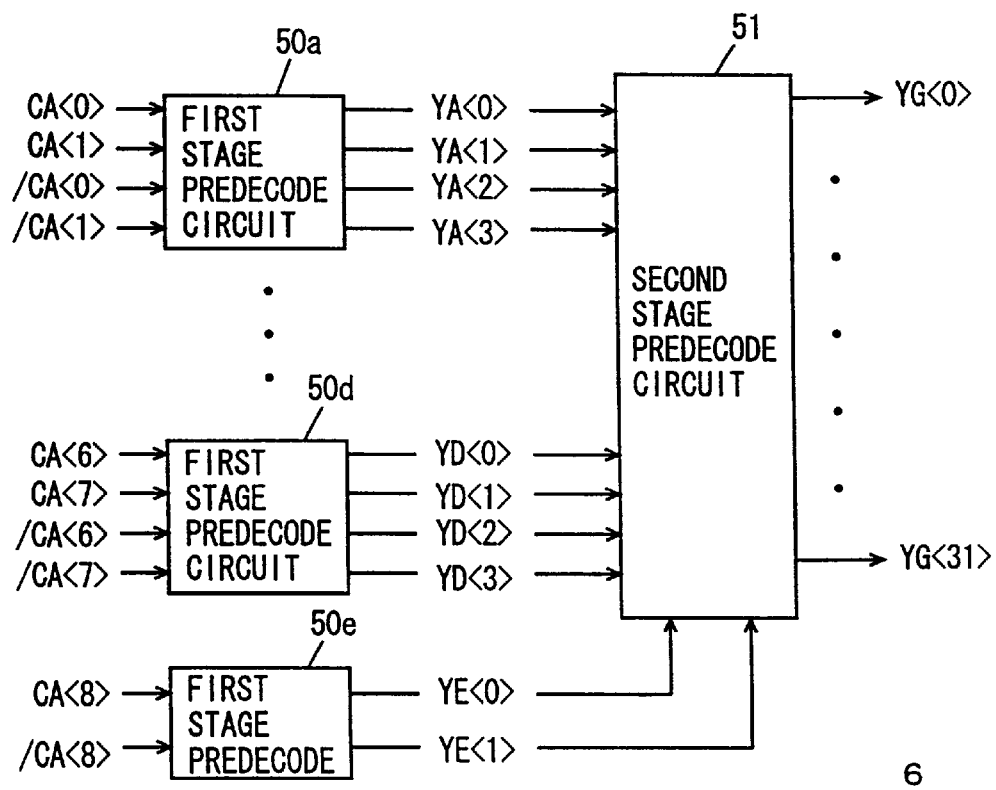
FIG. 21 is a modification of the predecoder shown in FIG. 1.

Fourth Embodiment
Predecoder Structure 2:

FIG. 21 is a schematic diagram illustrating a structure of a predecoder 6 according to the fourth embodiment of the present invention. FIG. 21 shows a structure for predecoding 9-bit column address signal CA<0>–CA<8> as one example. Predecoder 6 includes the first stage predecode circuits 50a–50d provided respectively to 2-bit column address signals, and a first stage predecode circuit 50e provided to column address signal bit -CA<8>. The first stage predecode circuit 50a predecodes column address signal bits CA<0>, /CA<0>, CA<1>, and /CA<1> and generates predecoding signals YA<0>–YA<3>.

The first stage predecode circuit 50d predecodes column address signal bits CA<6>, CA<7>, /CA<6> and /CA<7> to generate predecode signals YD<0>–YD<3>. The first stage predecode circuit 50e predecodes column address signal bits CA<8> and /CA<8> to generate predecode signals YE<0> and YE<1>. The first stage predecode circuits 50a–50d and 50e each drive one of corresponding predecode signals into a selected state.

Predecoder 6 further includes a second stage predecode circuit 51 which predecodes predecode signals YA<0>–YA<3> . . . YD<0>–YD<3> from the first stage predecode circuits 50a–50d according to predecode signals YE<0> and YE<1> from the first stage predecode circuit 50e. Predecode signals YG<0>–YG<31> are output from the second stage predecode circuit. The first state predecode circuits 50a–50d drive four predecode signals among sixteen predecode signals into the selected state. Four of thirty-two predecode signal lines are driven into the selected state by the second stage predecode circuit 51. Compared with the case in which five predecode signals are driven into the selected state, the number of predecoder lines that are driven into the selected state is reduced and accordingly the power consumption decrease. Further, the decode circuit is the one having formed of a four input decode circuit so that the circuit scale of the decoder can be reduced.

The first stage predecode circuits 50a–50e are each constituted by a normal NAND type decode circuit.

Figure 22:
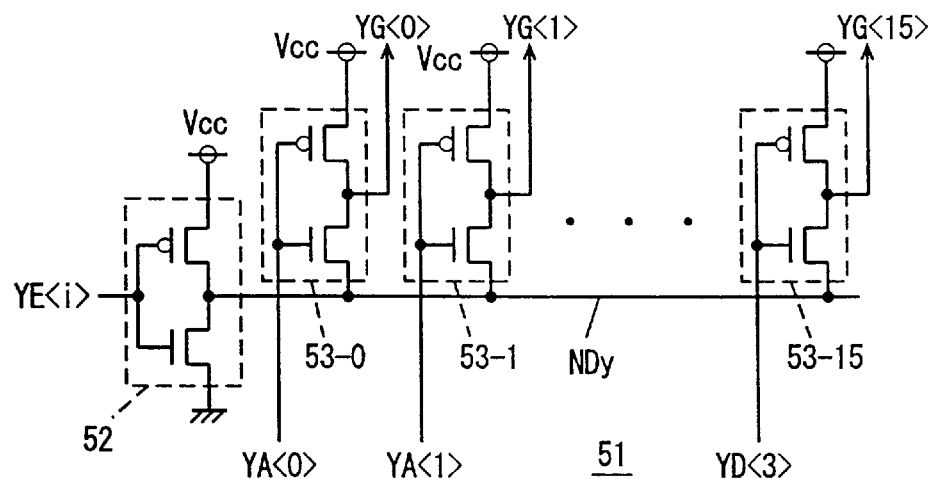
FIG. 22 shows a structure of a second stage predecode circuit shown in FIG. 21.

FIG. 22 illustrates a structure of the second stage predecode circuit 51 shown in FIG. 21. FIG. 22 illustrates a structure of the portion corresponding to predecode signals YG<0>–YG<15>. Referring to FIG. 22, the second stage predecode circuit 51 includes a CMOS inverter 52 which receives predecode signal YE<i>, and CMOS inverters 53-0-53-15 provided corresponding to respective predecode signals YA<0>–YA<3>. CMOS inverters 53-0-53-15 are each coupled between the power supply node and an output node NDy of CMOS inverter 52, and receive corresponding predecode signals YA<0>–YD<3> at respective inputs to output predecode signals YG<0>–YG<15>.

When predecode signal YE>i>(YE<0> or YE<1>) is at H level, output node NDy of CMOS inverter 52 is at the ground voltage level. Therefore, CMOS inverters 53-0-53-15 respectively drive predecode signals YG<0>–YG<15> to H level (power supply voltage Vcc level) or the ground voltage level according to corresponding predecode signals YA<0>–YD<3>.

When predecode signal YE<i> is at L level, output node NDy of CMOS inverter 52 is at supply voltage Vcc level. CMOS inverters 53-0-53-15 operate with the voltage on the power supply node receiving supply voltage Vcc and the voltage on output node NDy of CMOS inverter 52 being the operation power supply voltage. Predecode signal YG<0>–YG<15> output by these CMOS inverters 53-0-53-15 are at the supply voltage Vcc level regardless of the states of predecode signals YA<0>–YD<3>. Predecode signals YG<0>–YG<15> are at L level of the ground voltage level when selected, and at voltage Vcc level when they are not selected. The predecode signals are grouped in accordance with predecode signals YE<0> and YE<1>, and predecode signals YA<0> to YD<3> in the groups are predecoded in accordance with predecode signals YE<0> and YE<1> for specifying a group. In the selected group, a predecode signal for designating a column is driven into the selected state.

In the configuration of the predecode circuit illustrated in FIG. 22, the first stage predecode circuit 50e that outputs predecode signal YE<i> is required to drive the gate capacitance of CMOS inverter 52. CMOS inverter 52 merely drives output node NDy the ground voltage level or the supply voltage Vcc level. The sources of n channel MOS transistors of CMOS inverters 53-0-53-15 are coupled to output node NDy. The parasitic capacitance present at output node NDy is decreased compared with the cases which the gate capacitance of the MOS transistors are connected to output node NDy. Consequently, CMOS inverter 52 can drive output node NDy to the supply voltage Vcc level or ground voltage level at a high speed. The first stage predecode circuit 50e is only required to drive the gate capacitance of CMOS inverter 52 and is not required to drive CMOS inverters 53-0-53-15. Accordingly, the output load is reduced to allow the first stage predecode circuit 50e to drive predecode signal YE<i> (YE<0> or YE<i>) for specifying a group into the selected state at a high speed.

Figure 23:
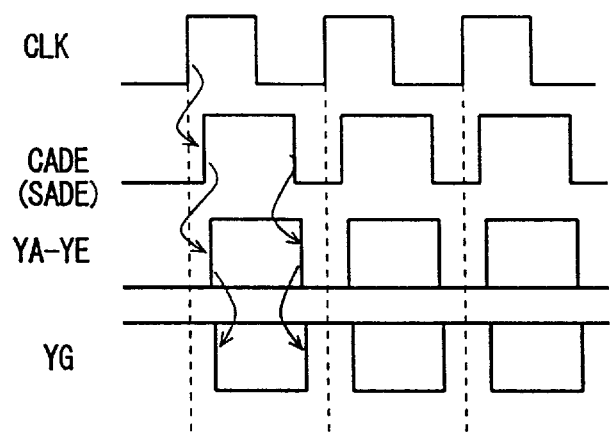
FIG. 23 shows signal waveforms representing an operation of the second stage predecode circuit shown in FIG. 22.

FIG. 23 is a timing chart representing an operation of the second stage predecode circuit shown in FIG. 22. Referring to FIG. 23, column address activation signal CADE (or counter address activation signal SADE) is driven into the active state synchronously with internal clock signal CLK. When column address activation signal CADE is driven into the active state, internal column address signal CA is set into the definite state and predecode signals YA–YE are output from the first stage predecode circuits 50a–50e. The timings at which these predecode signals YA–YE (YA<0>–YA<1>) are driven into the selected state are substantially the same with each other. Therefore, it is unnecessary to consider the timing margin in the second stage predecode circuit 51 when the predecode signals YA–YE are set into the definite state so that predecode signal YG (YG<0>–YG<15>) can be driven into the selected state at a faster timing.

When column address activation signal CADE is inactivated, the internal column address signal is similarly set into the standby state and accordingly predecode signals YA–YE are reset (L level is the initial state). Predecode signals YG (YG<0>–YG<15>) are reset into H level. The states of predecode signals YA–YG are always changed from the reset state to the selected state (when they are selected), and consequently predecode signals YA–YG can be driven into the selected state at a high speed.

In structure illustrated in FIG. 21, internal column address signal bits CA<0>–CA<8>, /CA<0>–/CA<8> are predecoded. However, the first stage predecode circuit 50a–50e may be configured to start a predecoding operation for internal address signals Ain and /Ain according to the column address activation signal or counter address activation signal. In this case, the first stage predecode circuits 50a–50e start the predecoding operation in response to activation of column address activation signal CADE (or counter address activation signal SADE), so that the timing at which the output predecode signal is defined is substantially the same (complementary address signals Ain and /Ain are generated at the same timing), and the second stage predecode circuit 51 can perform the predecoding operation at a faster timing (since it is unnecessary to consider the margin for the timing skew of the predecode signals).

Modification

Figure 24:
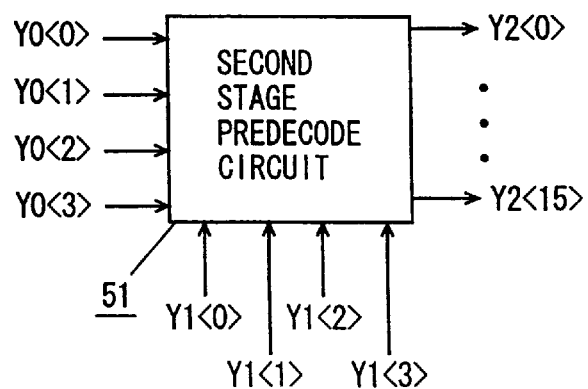
FIG. 24 is a modification of the second stage predecode circuit shown in FIG. 21.

FIG. 24 illustrates a modification of the second stage predecode circuit 11. Referring to FIG. 24, a second stage predecode circuit 51 further predecodes predecode signals Y0<0>–Y0<3> by predecode signals Y1<0>–Y1<3> to generate predecode signals Y2<0>–Y2<15>. The second stage predecode circuit 51 has the same structure as that illustrated in FIG. 22, and predecodes 4-bit predecode signals Y0<0>–Y0<3> respectively by predecode signals Y1<0>–Y1<3>. When one of predecode signals Y0<0>–Y0<3> is driven into the selected state and one of predecode signals Y1<0>–Y1<3> is driven into the selected state, one of 16-bit predecode signals Y2<0>–Y2<15> is driven into the selected state.

Figure 25:
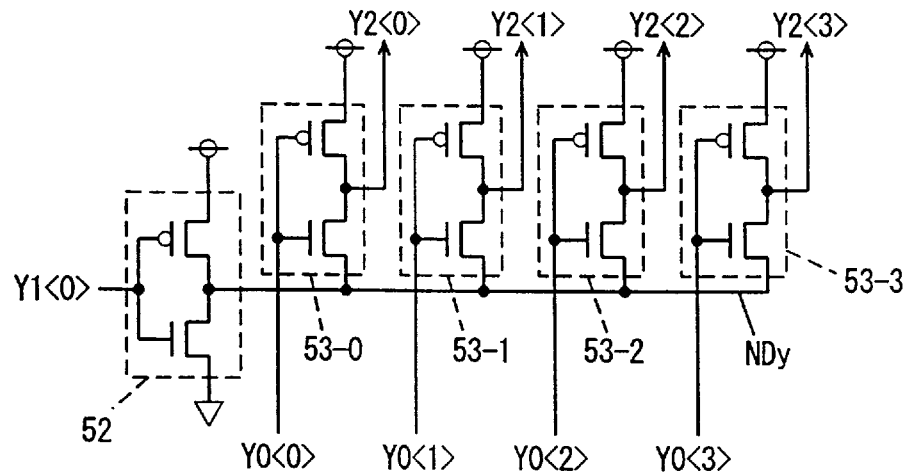
FIG. 25 illustrates a structure of the second stage predecode circuit shown in FIG. 24.

In the second stage predecode circuit 51 illustrated in FIG. 24, only the combination of the predecode signals is different, and one of predecode signals Y1<0>–Y1<3> is supplied as predecode signal YE<i> for specifying a group, and predecode signals Y0<0>–Y0<3> are supplied as predecode signals YA<0>–YD<3> for specifying a column in the group. As illustrated in FIG. 25, the source nodes (ground nodes) of four CMOS inverters 53-0-53-3 are connected to the output node NDy of CMOS inverter 52 receiving predecode signal Y1<0>.

The predecode circuit illustrated in FIG. 25 is provided corresponding to each of predecode signals Y1<0>–Y1<3>. The output load of the decoder that outputs predecode signals Y1<0>–Y1<3> is reduced relative to that of a predecoder having the NAND circuit structure, and accordingly predecode signals Y2<0>–Y2<3> can be generated at a high speed.

In those structures illustrated in FIGS. 24 and 25, predecode signals Y0<0:3> and Y1<0:3> may be directly generated from the internal address signal, or may be generated according to the internal column address signal.

According to the fourth embodiment of the present invention, when the first predecode signal for designating a column in the group is further predecoded by the second predecode signal for specifying a group, the second predecode signal is received by first CMOS inverter and second CMOS inverter is connected between the output node of first CMOS inverter and the power supply node, and the first predecode signal is supplied to each of CMOS inverters. Consequently, the load of the second predecode signal output circuit is reduced and the predecoding operation can be done at a high speed.

In addition, the first and second predecode signals are reset in each clock cycle into the initial state so that they can be changed speedily into the definite state when they are selected.

Fifth Embodiment

Figure 26:
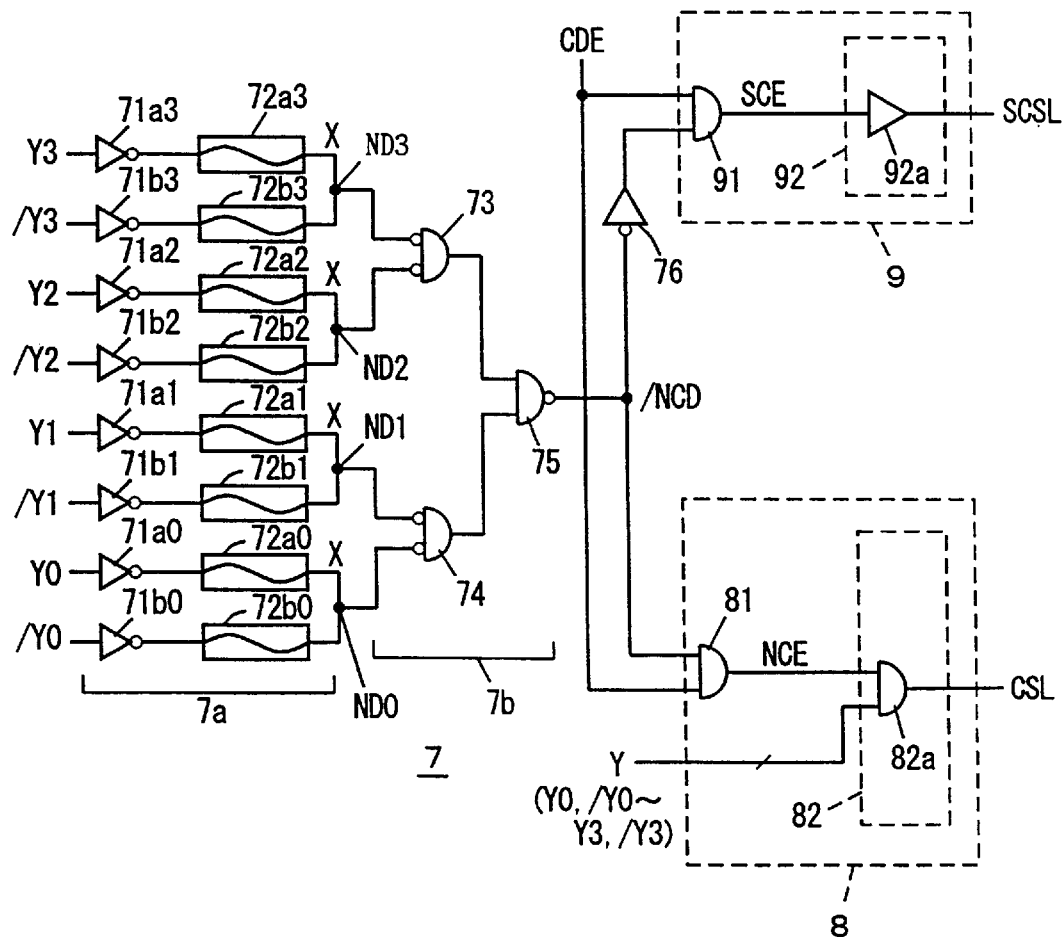
FIG. 26 is a schematic diagram illustrating structures of a spare determination circuit, a spare column decoder, and a column decoder shown in FIG. 1.

FIG. 26 is a schematic diagram illustrating a structure of a main portion of a synchronous semiconductor memory device according to the fifth embodiment of the present invention. FIG. 26 shows spare determination circuit 7, column decoder 8 and spare column decoder 9 illustrated in FIG. 1. FIG. 26 shows the case in which predecode signals Y0–Y3 and /Y0–/Y3 are used.

Referring to FIG. 26, spare determination circuit 7 includes a programming circuit 7a provided corresponding to a redundant column and storing a column address of a defective column to be replaced by the redundant column, and a determination circuit 7b determining whether the supplied column address signal designates a defective column or not by comparing the received column address signal with the defective column address programmed in programming circuit 7a. Predecode signals Y0–Y3 correspond to predecode signals YG<0>–YG<31> or Y2<0>–Y2<15> shown in FIG. 21 or FIG. 24.

Programming circuit 7a includes inverter buffers 71a0, 71b0–71a3, and 71b3 corresponding to predecode signals Y0, /Y0–Y3, and /Y3, and fuse elements 72a0, 72b0–72a3 and 72b3 corresponding to inverter buffers 71a0, 71b0–71a3, 71b3 respectively. The address of a defective column is stored by blowing /not blowing fuse elements 72a0, 72b0–72a3, and 72b3. First ends of fuse elements corresponding to a pair of complementary predecode signals are commonly coupled. Specifically, first ends of fuse elements 72a0 and 72b0 are commonly connected to a node ND0, and first ends of fuse elements 72a1 and 72b1 are commonly connected to a node ND1, first ends of fuse elements 72a2 and 72b2 are commonly connected to a node N2, and first ends of fuse elements 72a3 and 72b3 are commonly connected to a node ND3.

Determination circuit 7b includes a 2-input NOR circuit 73 receiving signals on nodes ND3 and ND2, a 2-input NOR circuit 74 receiving signals on nodes ND0 and ND1, and a 2-input NAND circuit 75 receiving output signals of NOR circuits 73 and 74 to output a normal column decoder disable signal /NCD. When normal column decoder disable signal /NCD from NAND circuit 75 is set into L level of the active state, column decoder 8 is inactivated and its decoding operation is inhibited while spare column decoder 9 is activated to drive a corresponding redundant column into the selected state.

Column decoder 8 includes an AND circuit 81 which receives normal column decoder disable signal /NCD and column decoder enable signal CDE, and a column decode circuit 82 which is activated in response to normal column decoder enable signal NCE from AND circuit 81 to decode supplied predecode signals Y (Y0, /Y0–Y3, /Y3) for selecting a corresponding column. FIG. 26 representatively shows an AND type decode circuit 82a corresponding to column selection line CSL.

Spare column decoder 9 includes an AND circuit 91 which receives normal column decoder disable signal /NCD supplied via an inverter 76 and column decoder enable signal CDE, and a spare column decode circuit 92 which drives a corresponding redundant column selection line SCSL into the selected state in response to spare column decoder enable signal SCE from AND circuit 91. FIG. 26 representatively shows a buffer circuit 92a which is provided corresponding to spare column selection line SCSL.

If a plurality of redundant columns are provided, programming circuit 7a and determination circuit 7b are provided corresponding to each redundant column. Normal column decoder disable signal /NCD is generated by a wired-AND of output signals of a plurality of determination circuits 7b. An operation is briefly described below.

Fuse elements 72a0, 72b0–72a3, and 72b3 are blown/not blown according to an address of a redundant column. If fuse elements 72a0–72a3 are blown and fuse elements 72b0–72b3 are not blown, an address that sets predecode signals Y0–Y3 all at L level corresponds to a defective column. If a normal column is designated, at least one of predecode signals Y0–Y3 is at L level. Specifically, at least one of complementary predecode signals /Y0–/Y3 is at H level, and the other predecode signals are at L level. Even if a signal of L level is transmitted to at least one of nodes ND0–ND3 via corresponding inverter 71b, a signal of H level is transmitted to remaining nodes. Therefore, output signal (s) of NOR circuits 73 and/or 74 is at L level, and an output signal of NAND circuit 75 is at H level. Specifically, when normal column decoder disable signal /NCD is at H level and column decoder enable signal CDE rises to H level, normal column decoder enable signal NCE from AND circuit 81 attains H level in column decoder, 8 which in turn decodes predecode signal Y and drives corresponding column selection line CSL into the selected state. In spare column decoder 9, an output signal of inverter 76 is at L level, spare column decoder enable signal SCE is at L level, and a spare column is not selected.

If all of predecode signals Y0–Y3 that are supplied are at L level, complementary predecode signals /Y0–/Y3 are at H level and output signals of inverters 71b0–71b3 attain L level. Signals of L level are transmitted to nodes ND0–ND3, output signals of both of NOR circuits 73 and 74 attain H level, and normal column decoder disable signal /NCD from NAND circuit 75 falls to L level. When column decoder enable signal CDE rises to H level, normal column decoder enable signal NCE maintains L level, while spare column decoder enable signal SCE rises to H level and spare column selection line SCSL is selected.

Figure 27:
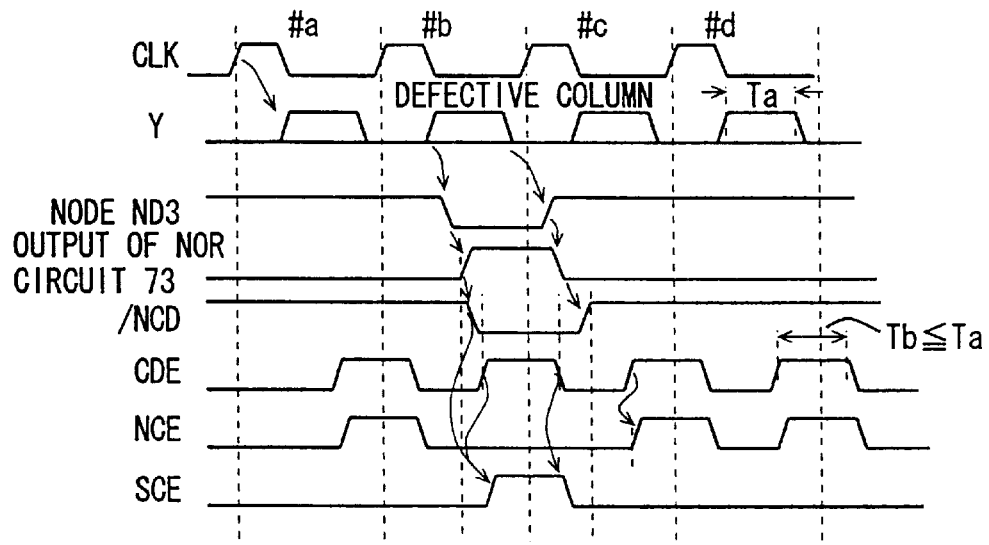
FIG. 27 illustrates signal waveforms representing an operation of the spare determination circuit shown in FIG. 26.

Referring now to the timing chart of FIG. 27, an operation of spare determination circuit 7 is described.

In clock cycle #a, predecode signal Y is supplied. If predecode signal Y designates a normal column, the voltage level of node ND3 is maintained at H level and an output signal of NOR circuit 73 is maintained at L level. In clock cycle #a, column decoder enable signal CDE is activated at a prescribed timing. Normal column decoder disable signal /NDC is in the H level state, so that normal column decoder enable signal NDE is set into the active state according to column decoder enable signal CDE, and column decode circuit 82 performs the column selecting operation. After a prescribed time passes, predecode signal Y is reset to L level of the initial state (see the first to the fourth embodiments).

In the next clock cycle #b, after predecode signal Y is reset to L level, a following predecode signal Y changes. If a defective column is designated in clock cycle #b, the voltage level of nodes ND3 falls to L level and the voltage levels of the other nodes ND0–ND2 also fall to L level. Accordingly, output signals of NOR circuits 73 and 74 rise from L level to H level, and normal column decoder disable signal /NCD from NAND circuit 75 falls to L level. In this state, when column decoder enable signal CDE rises to H level, spare column decoder enable signal SCE is set into H level via inverter 76 and AND circuit 91, and spare column selection line SCSL is driven into the selected state.

When column decoder enable signal CDE falls to L level, spare column decoder enable signal SCE also falls to L level, so that selection of a spare column is completed.

In clock cycle #b, predecode signal Y is reset to L level, returning the voltage levels of nodes ND0–ND3 all to H level. Accordingly, output signals of NOR circuits 73 and 74 fall to L level and normal column decoder disable signal, NCD from NAND circuit 75 rises to H level.

In clock cycle #c, the state of predecode signal Y again changes to be defined. If a normal column is designated in clock cycle #c, normal column decoder disable signal /NCD maintains H level. Therefore, when column decoder enable signal CDE rises to H level, normal column decoder enable signal NCE immediately rises to start a decoding operation by column decode circuit 82.

In each clock cycle, the predecode signal can be changed and made definite at an advanced timing by resetting predecode signal Y in each clock cycle as shown in FIG. 27. By resetting predecode signal Y, all of the internal nodes in determination circuit 7b are reset into the initial state. Therefore, when column decoder enable signal CDE is activated, normal column decoder disable signal /NCD is in the initial state of H level, so that normal column decoder enable signal NCE can be driven into the selected state immediately according to column decoder enable signal CDE, and a normal column selecting operation can be done at a high speed in a following clock cycle immediately after a defective column is selected.

If predecode signal Y is reset, activation period Ta of predecode signal Y is made longer than period Tb in which column decoder enable signal CDE is in the active state. Accordingly, it is possible to prevent a column selecting operation from being completed forcibly regardless of the state of column decoder enable signal CDE due to reset of predecode signal Y in the column selecting operation.

Figure 28A:
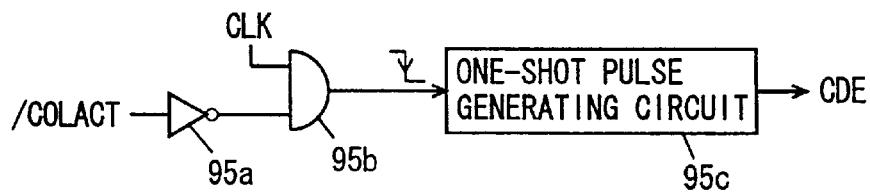
FIGS. 28A and 28B are schematic diagrams each illustrating a structure of a column decoder enable signal generating portion shown in FIG. 26.

FIG. 28A is a schematic diagram illustrating a column decoder enable signal generating portion. The circuit that generates column decoder enable signal CDE is included in the control circuit shown in FIG. 1. Referring to FIG. 28A, the column decoder enable signal generating portion includes an inverter 95a which receives column selecting operation activation signal /COLACT, an AND circuit 95b which receives an output signal of inverter 95a and internal clock signal CLK, and a one-shot pulse generating circuit 95c which generates a one-shot pulse signal in response to falling of an output signal of AND circuit 95b. The one-shot pulse signal from one-shot pulse generating circuit 95c is used as column decoder enable signal CDE.

Column selecting operation activation signal /COLACT is held at L level of the active state during the burst length period. When internal clock signal CLK falls, an output signal of AND circuit 95b falls to L level. In each clock cycle, column decoder enable signal CDE can be driven into the active state at a faster timing by generating the one-shot pulse signal in response to falling of the output signal of AND circuit 95b. In this case, the time width of the one-shot pulse from one-shot pulse generating circuit 95c is set to correspond to a period during which predecode signal Y is in the active state at maximum. This is easily implemented by adjusting the pulse width of the one-shot pulse generating circuit in the circuit portion which generates column address activation signal CADE.

Figure 28B:
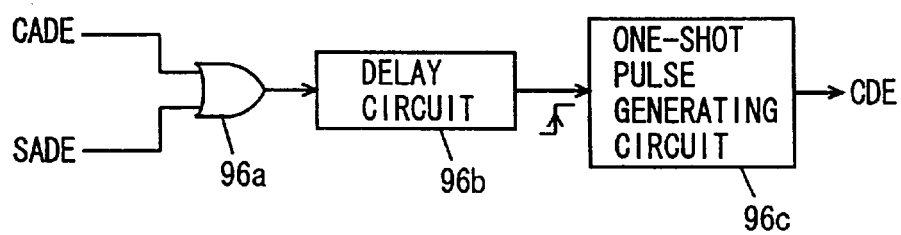

FIG. 28B is a schematic diagram illustrating another structure of the column decoder enable signal generating portion. Referring to FIG. 28B, the column decoder enable signal generating portion includes an OR circuit 96a which receives column address activation signal CADE and counter address activation signal SADE, a delay circuit 95b which delays an output signal of OR circuit 96a by a prescribed time, and a one-shot pulse generating circuit 96c which generates a one-shot pulse signal in response to rising of an output signal of delay circuit 96b. The one-shot pulse signal from one-shot pulse generating circuit 96c is output as column decoder enable signal CDE.

In the structure illustrated in FIG. 28B, after predecode signal Y is set into the definite state by activating column address activation signal CADE or counter address activation signal SADE, column decoder enable signal CDE can be driven into the active state and a column decoding operation can be performed correctly. The pulse width of one-shot pulse generating circuit 96c is also set approximately equal to the pulse width of column address activation signal CADE and counter address activation signal SADE or less. Even if the structure shown in FIG. 28B is employed, column decoder enable signal CDE can be driven into the active/inactive state in each clock cycle.

Figure 29:
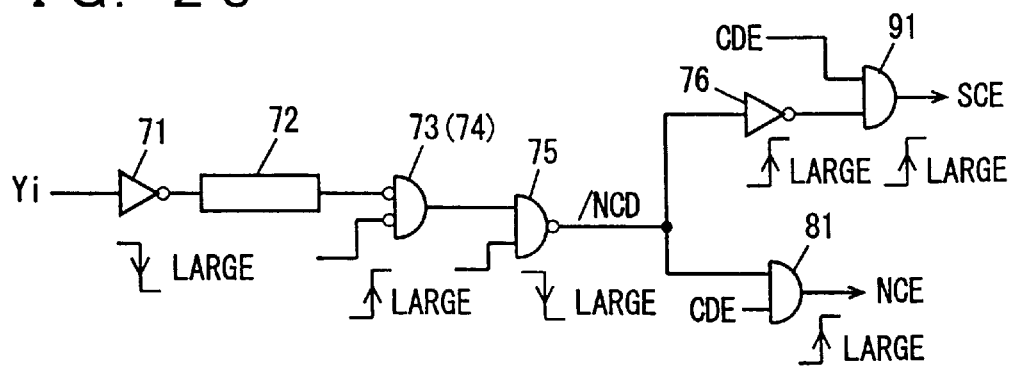
FIG. 29 is a schematic diagram illustrating current driving capability of an elementary gate of the spare determination circuit shown in FIG. 26.

FIG. 29 illustrates the current driving capabilities of the gates in spare determination circuit 7. Referring to FIG. 29, inverters 71a0, 71b0–71a3 and 71b3 in the input stage are represented by an inverter 71, and fuse elements 72a0, 72b0–72b3 are represented by a fuse element 72.

Referring to FIG. 29, inverter 71 in the input stage has a larger current driving capability for falling the output signal from H level to L level. An NOR circuit 73 (or 74) has a larger current driving capability for raising the output signal from L level to H level. An NAND circuit 75 has a larger current driving capability for falling the output signal from H level to L level. An inverter 76 has a larger current driving capability for raising the output signal from L level to H level. An AND circuit 81 has a larger current driving capability for raising the output signal NCE from L level to H level. An AND circuit 91 has a larger driving capability for raising the output signal SCE from L level to H level.

When the output driving capability of each gate is set as illustrated in FIG. 29, a spare determination operation can be done speedily as described below.

Figure 30:
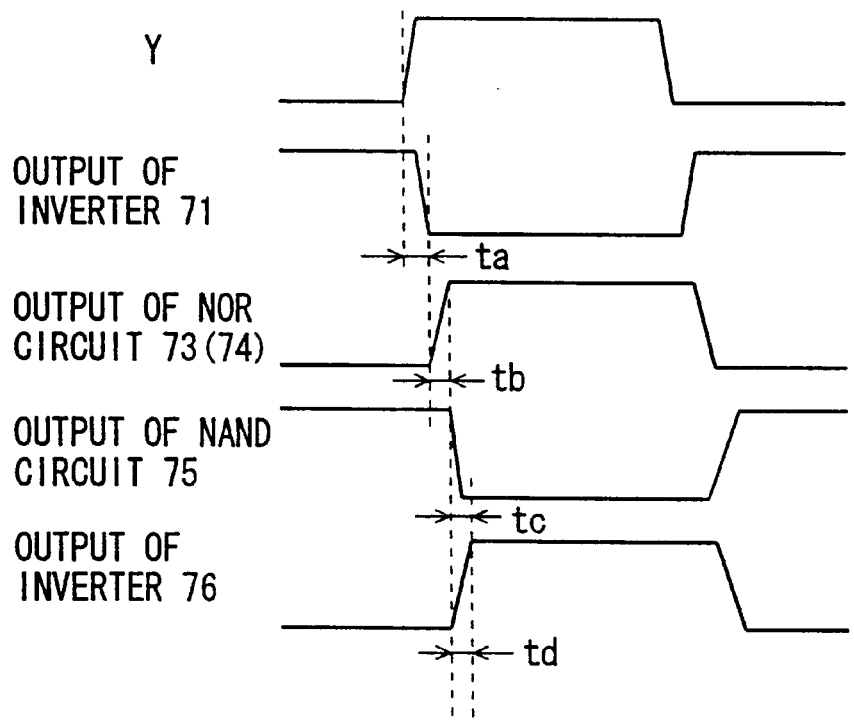
FIG. 30 illustrates signal waveforms representing an operation of the spare determination circuit shown in FIG. 29.

Specifically, referring to FIG. 30, after predecode signal Y rises to H level, the output signal of inverter 71 falls to L level. Inverter 71 has a larger current driving capability for driving into L level, and the output signal of inverter 71 is defined at L level after time ta elapsed from the time at which predecode signal Y rises to H level.

The output signal of NOR circuit 73 (or 74) rises to H level according to the L level signal from inverter 71. NOR circuit 73 (and 74) has a larger current driving capability for raising the output signal to H level, and the output signal of NOR circuit 73 (74) is defined at H level after time tb elapsed from the time at which the output signal of inverter 71 falls to L level.

NAND circuit 75 drives output signal /NCD into L level according to output signals of NOR circuits 73 and 74. When output signals of NOR circuits 73 and 74 are defined at H level, output signal /NCD of NAND circuit 75 is driven into L level to be definite after time tc elapsed. Inverter 76 inverts signal /NCD. Inverter 76 has a larger capability for raising the output signal, and sets the output signal at H level after time td passes from the time at which normal column decoder disable signal /NCD from NAND circuit 75 falls to L level. When column decoder enable signal CDE rises to H level, spare column enable signal SCE can be driven into H level speedily. AND circuit 91 has a larger driving capability for raising the output signal SCE to H level, so that spare column enable signal SCE can be driven into the active state at a high speed.

AND circuit 81 is in the disable state when normal column decoder disable signal /NCD is activated. If a normal column is selected, AND circuit 81 raises output signal NCE to H level according to activation of column decoder enable signal CDE.

In the structure illustrated in FIG. 29, if predecode signal Y is reset in each clock cycle, and output signals of inverter 71, NOR circuits 73 and 74, NAND circuit 75, inverter 76, and AND circuits 81 and 91 are driven into the reset state, it may be enough to reliably reset those output signals in each reset period. When a redundant column is to be used, by increasing the current driving capabilities of these gates in a direction in which normal column decoder disable signal /NCD is driven into the active state, the spare determination result (the use of a redundant column) can be driven into the definite state after time ta+tb+tc+td from the time at which predecode signal Y is defined. Accordingly, column decoder enable signal CDE can be activated at an advanced timing and the column selecting operation can be started at a faster timing. Further, it is possible to prevent a normal column from being erroneously selected by the decoding operation of column decoder 8 when a spare column is used.

If the current driving capabilities for driving these gates i.e., the output nodes of inverter 71, NOR circuits 73 and 74, NAND circuit 75, inverter 76 and AND circuits 81 and 91 are set as illustrated in FIG. 29, the distribution of the current driving capabilities can be easily implemented by adjusting the ratio of the gate width to gate length of MOS transistors that are components of the gates.

Figure 31A:
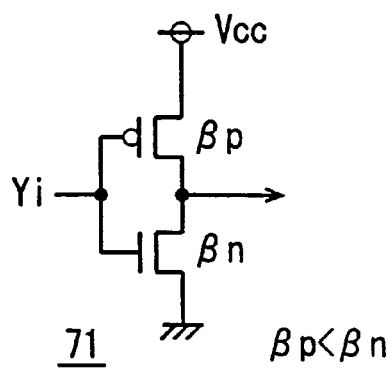
FIGS. 31A and 31B specifically show a structure of a gate circuit shown in FIG. 29.

Referring to FIG. 31A, transmission factor $\beta p$ of the p channel MOS transistor is set lower than transmission factor $\beta n$ of the n channel MOS transistor in inverter 71, for example. Accordingly, when predecode signal Yi rises to H level, the output signal of inverter 71 can be driven into L level at high speed.

Figure 31B:
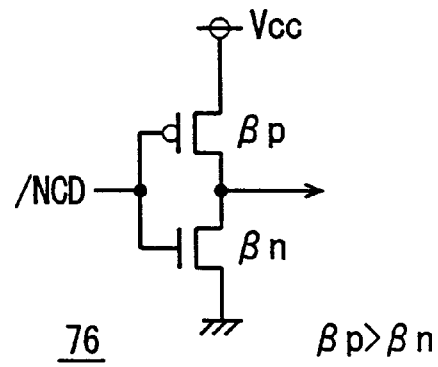

Referring to FIG. 31B, transmission factor $\beta p$ of the p channel MOS transistor is set larger than transmission factor $\beta n$ of the n channel MOS transistor in inverter 76. Accordingly, when normal column decoder disable signal /NCD falls to L level of the active state, the output signal of inverter 76 can be speedily driven into H level. The relative magnitude of transmission factors $\beta p$ and $\beta n$ can be set by setting the ratio of the gate width and the gate length of the MOS transistor to an appropriate value.

The distribution of the required output node driving capabilities can be implemented similarly in remaining NOR circuits 73 and 74, NAND circuit 75, and AND circuits 81 and 91 as illustrated in FIG. 29 by appropriately setting the ratio of $\beta$ of the MOS transistors driving the respective output nodes.

According to the fifth embodiment, the predecode signal is reset to a prescribed voltage level in each clock cycle, so that a normal column can be selected at the timing which is the same as that of the normal cycle even after a redundant column is selected. Consequently, the column selecting operation can be done speedily. Further, spare determination that a redundant column is to be used can be made speedily by appropriately adjusting the $\beta$ ratio of the MOS transistors of a gate circuit of the spare determination circuit, and the redundant column can be driven into the selected state at a high speed.

In the description presented above, the structure of the AND type spare determination circuit is discussed. However, the structure of the spare determination circuit may be any other one. For example, the spare determination circuit may be an OR type spare determination circuit in which MOS transistors receiving predecode signals are connected in parallel with an output node.

The predecode signal may be reset to H level.

In each clock cycle, the predecode signal is reset to a prescribed voltage level, so that the spare determination circuit can reset an internal node into the initial state in each clock cycle. Consequently, the spare determination operation can be done at a high speed (since the operation is not influenced by the result of the determination of the preceding clock cycle).

Sixth Embodiment

Figure 32:
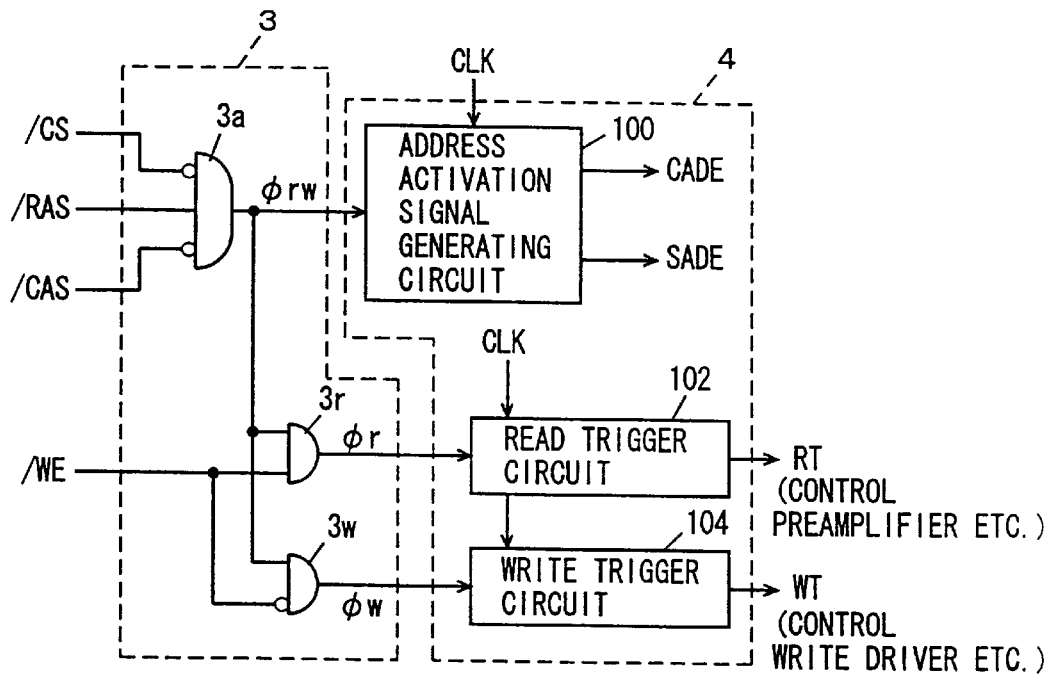
FIG. 32 is a schematic diagram illustrating structures of the command decoder and the control circuit shown in FIG. 1.

FIG. 32 more specifically shows the structures of the command decoder 3 and control circuit 4 shown in FIG. 1. Referring to FIG. 32, command decoder 3 includes an access command decode circuit 3a which receives chip select signal /CS, row address strobe signal MRAS and column address strobe signal /CAS and outputs column selecting operation instruction signal $\phi$rw, a read command decode circuit 3r which receives column selecting operation instruction signal $\phi$rw and write enable signal /WE and generates reading operation instruction signal $\phi$r, and a write command decode circuit 3w which receives column selecting operation instruction signal $\phi$rw and write enable signal /WE and generates writing operation instruction signal $\phi$w.

Access command decode circuit 3a activates column selecting operation instruction signal $\phi$wr when chip select signal /CS and column address strobe signal /CAS are both at L level and row address strobe signal /RAS is at H level.

Read command decode circuit 3r activates reading operation instruction signal $\phi$r when column selecting operation instruction signal $\phi$rw is at H level of the active state and write enable signal /WE is at H level. Write command decode circuit 3w drives writing operation instruction signal $\phi$w to H level of the active state when column selecting operation instruction signal $\phi$rw is at H level of the active state and write enable signal /WE is at L level.

Control circuit 4 includes an address activation signal generating circuit 100 which outputs column address activation signal CADE and counter address activation signal SADE according to internal clock signal CLK when column selecting operation instruction signal $\phi$rw is activated, a read trigger circuit 102 which outputs read trigger signal RT in response to internal clock signal CLK when reading operation instruction signal $\phi$r is activated, and a write trigger circuit 104 which generates write trigger signal WT in response to internal clock signal CLK when writing operation instruction signal $\phi$w is activated.

Address activation signal generating circuit 100 has a its structure similar to that described in connection with the first embodiment referring to FIGS. 2–11, and activates column address activation signal CADE in the first clock cycle and activates counter address activation signal SADE in the following cycles synchronously with internal clock signal CLK when column selecting operation activation signal $\phi$rw is activated.

Read trigger signal RT from read trigger circuit 102 causes a preamplifier, a read data transfer circuit, and a data output circuit (not shown) to be activated successively, and data are thus read. In response to activation of write trigger signal WT, write data is transferred and the data is written into a selected memory cell by transfer of write data and activation of the write driver.

Figure 33:
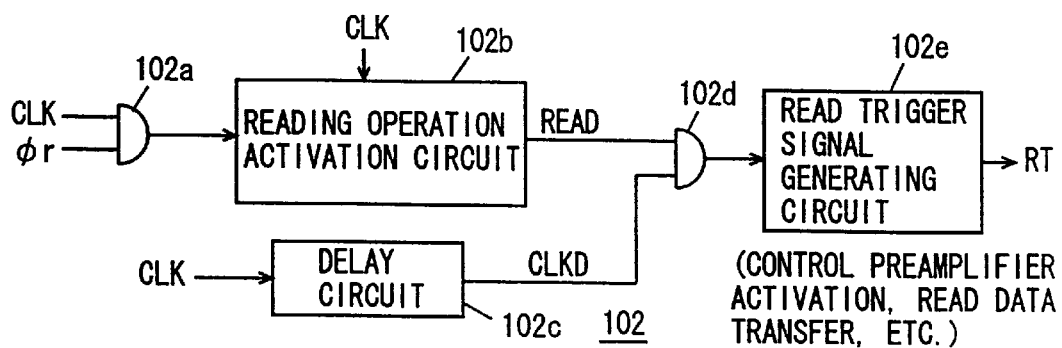
FIG. 33 is a schematic diagram illustrating a structure of a read trigger circuit shown in FIG. 32.

FIG. 33 is a schematic diagram illustrating a structure of read trigger circuit 102 shown in FIG. 32. Referring to FIG. 33, read trigger circuit 102 includes an AND gate 102a receiving internal clock signal CLK and reading operation instruction signal $\phi$r, a reading operation activation circuit 102b started in response to activation of an output signal of AND gate 102a, for holding reading operation activation signal READ in the active state during the burst length period, a delay circuit 102c delaying internal clock signal CLK by a prescribed time, an AND gate 102d receiving reading operation activation signal READ and output signal CLKD of delay circuit 102c, and a read trigger signal generating circuit 102e generating read trigger signal RT in the form of a one-shot pulse signal having a prescribed time width in response to activation of the output signal of AND gate 102d. According to read trigger signal RT from read trigger signal generating circuit 102e, the preamplifier is activated and, data amplified by the preamplifier is transferred.

Reading operation activation circuit 102b has a structure similar to that of the column selecting operation activation signal generating portion illustrated in FIG. 5, and is constituted of, for example, a set/reset flip-flop which is set in response to activation of the output signal of AND gate 102a and reset after the burst length period elapsed.

Figure 34:
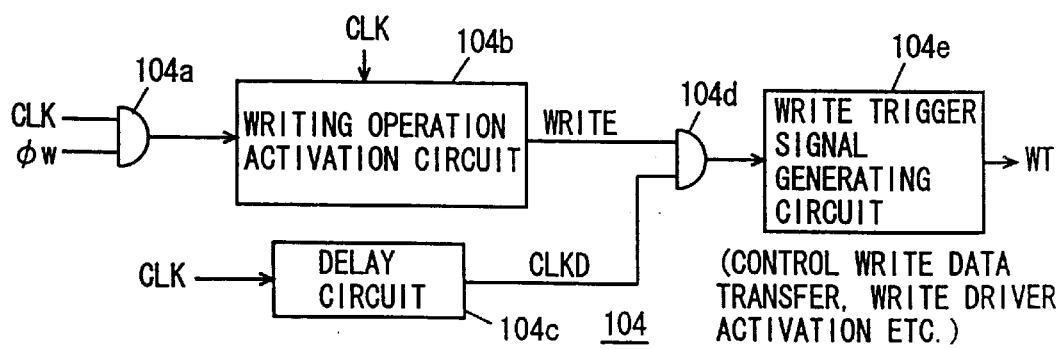
FIG. 34 is a schematic diagram illustrating a write trigger circuit shown in FIG. 32.

FIG. 34 illustrates a structure of write trigger circuit 104 shown in FIG. 32. Referring to FIG. 34, write trigger circuit 104 includes an AND gate 104a receiving internal clock signal CLK and writing operation instruction signal φw, a writing operation activation circuit 104b started in response to activation of an input signal of AND gate 104a, for holding writing operation activation signal WRITE in the active state during the burst length period, a delay circuit 104c delaying internal clock signal CLK by a prescribed time, an AND gate 104d receiving writing operation activation signal WRITE and output signal CLKD of delay circuit 104c, and a write trigger signal generating circuit 104e generating a one-shot pulse signal having a prescribed time width in response to activation of the output signal of AND gate 104d. The one-shot pulse signal from write trigger signal generating circuit 104e is output as write trigger signal WT. Write trigger signal WT is used for controlling transfer of write data, activation of the write driver and the like. Referring to the timing chart shown in FIG. 35, the operations of the circuits illustrated in FIGS. 32 to 34 are described.

In clock cycle #a, chip select signal /CS and column address strobe signal /CAS are set at L level, and row address strobe signal /RAS and write enable signal /WE are set at H level. The combination of the states of the control signals corresponds to a read command to set column selecting operation instruction signal φrw from access command decode circuit 3a shown in FIG. 32 at H level of the active state, and to set reading operation instruction signal φr at H level of the active state.

Figure 35:
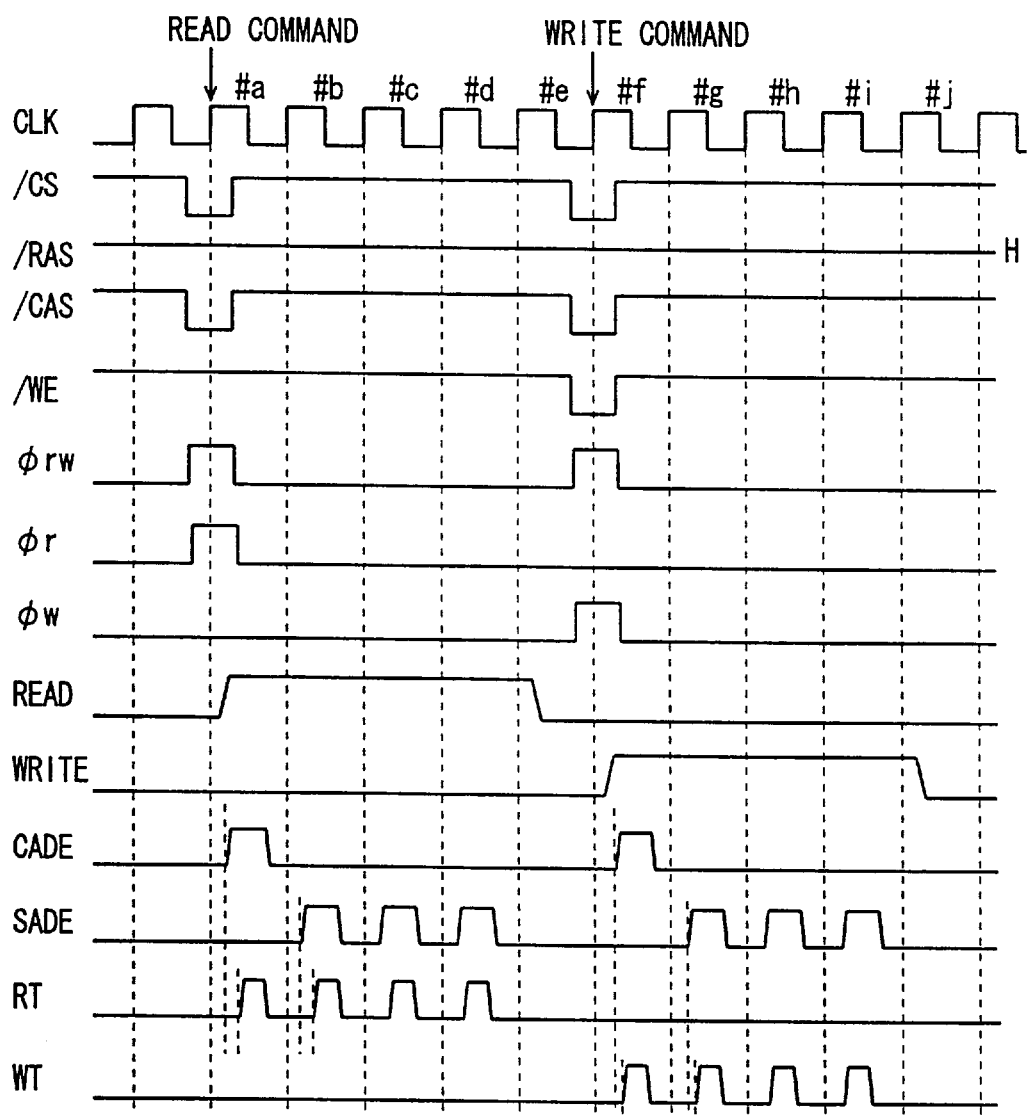
FIG. 35 is timing chart representing operations of those circuits shown in FIG. 32 to FIG. 34.

When internal clock signal CLK rises to H level, reading operation activation circuit 102b is activated and reading operation activation signal READ rises to H level in read trigger circuit 102. Reading operation activation signal READ is held in the active state of the H level during the burst length period (4 in FIG. 35). Referring to FIG. 35, reading operation activation signal READ is held at H level over clock cycles #a to #d.

Address activation signal generating circuit 100 shown in FIG. 32 drives column address activation signal CADE into the active state synchronously with rising of internal clock signal CLK according to activation of column selecting operation instruction signal φrw. In response to activation of reading operation activation signal READ, read trigger signal generating circuit 102e shown in FIG. 33 drives read trigger signal RT into the active state for a prescribed period in response to rising of delay clock signal CLKD from delay circuit 102c.

In the following clock cycles #b to #d, a column address is designated according to an internal burst address counter. In clock cycles #b to #d, counter address activation signal SADE from address activation signal generating circuit 100 shown in FIG. 32 is driven into the active state synchronously with internal clock signal CUK. Further, read trigger signal generating circuit 102e shown in FIG. 33 operates to drive read trigger signal RT into the active state for a prescribed period in response to rising of delay internal clock signal CLKD which is a delayed signal of internal clock signal CLK. Accordingly, in clock cycles #b to #d, after counter address activation signal SADE is activated, read trigger signal RT is generated. After the burst length period passes, in clock cycle #e, reading operation activation signal READ from reading operation activation circuit 102b changes its state to the inactive state of L level.

In clock cycle #f, chip select signal /CS, column address strobe signal /CAS, and write enable signal /WE are set at L level, and row address strobe signal /RAS is held at H level. The combination of the states of those control signals corresponds to a write command to drive column selecting operation instruction signal φrw from access command decode circuit 3a shown in FIG. 32 into the active state and to set writing operation instruction signal 0w from write command decode circuit 3w to the active state of H level.

When internal clock signal CLK rises to H level, writing operation activation circuit 104b in write trigger circuit 104 shown in FIG. 35 is started to hold writing operation activation signal WRITE in the active state for the burst length period. Address activation signal generating circuit 100 shown in FIG. 32 operates to hold column address activation signal CADE in the active state of H level for a prescribed period in response to rising of internal clock signal CLK. In response to activation of writing operation activation signal WRITE, write trigger signal generating circuit 104e shown in FIG. 34 operates, and write trigger signal WT is activated in response to rising of delay internal clock signal CLKD from delay circuit 104c.

For a period from clock cycle #g to clock cycle #i, address activation signal generating circuit 100 shown in FIG. 32 activates counter address activation signal SADE synchronously with internal clock signal CLK. After the counter address activation signal SADE is activated, write trigger signal generating circuit 104e shown in FIG. 34 activates write trigger signal WT in response to rising of delay internal clock signal CLKD. After the burst length period elapses, in clock cycle #j, writing operation activation signal WRITE from writing operation activation circuit shown in FIG. 34 is inactivated.

Figure 36:
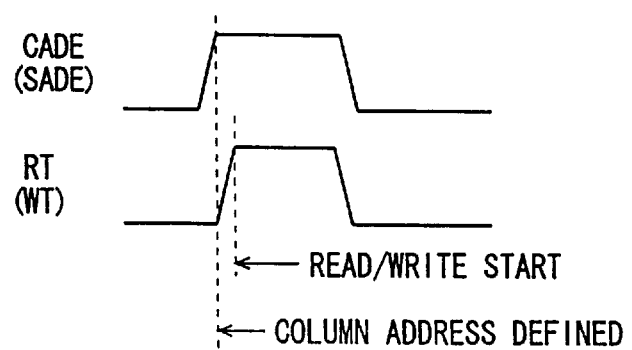
FIG. 36 illustrates specific operations performed by an address activation signal and a read/write trigger signal.

In the circuit structures illustrated in FIGS. 32 to 34, the internal data writing or reading operation is started after an externally supplied address signal or an internally generated address signal is defined as a column address signal. Specifically, referring to FIG. 36, when the column address activation signal (or counter address activation signal SADE) is activated and the internal column address signal is defined, read trigger signal RT (or write trigger signal WT) is activated and the internal data reading (writing) operation is started. Accordingly, it is possible to prevent the reading/writing operation from being performed before the internal column address is defined to cause the data writing/reading to be done for a column which is not defined.

The column decoder merely performs the decoding operation according to the supplied column address signal (or predecode signal), and a memory cell column is connected to an internal data bus when column selection line CSL is driven into the selected state. Data are read and written for the internal data bus by the preamplifier or the write driver. A structure for optimizing the timing at which the column decoder is activated is hereinbelow described.

Figure 37:
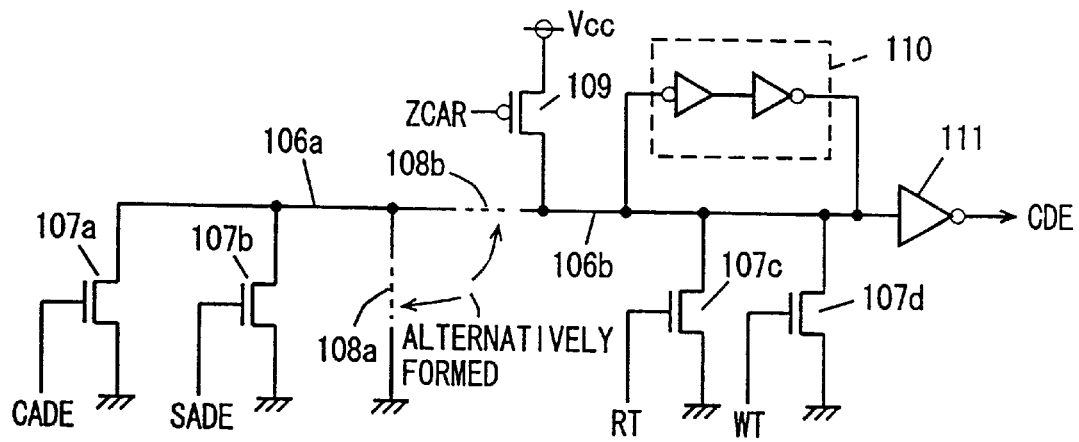
FIG. 37 illustrates a structure of a column decoder enable signal generating portion.

FIG. 37 illustrates a structure of a column decoder enable signal generating portion. referring to FIG. 37, the column decoder enable signal generating portion includes n channel MOS transistors 107a and 107b connected in parallel to each other between a node 106a and the ground node and having respective gates receiving column address activation signal CADE and counter address activation signal SADE, n channel MOS transistors 107c and 107d connected in parallel to each other between a node 106b and the ground node and having respective gates receiving read trigger signal RT and write trigger signal WT, an interconnection line 108a selectively formed between node 106a and the ground node, and an interconnection line 108b selectively formed between node 106a and node 106b. Interconnection lines 108a and 108b are alternatively formed. When interconnection line 108a is formed, interconnection line 108b is not formed, and node 106a and node 106b are disconnected. If interconnection line 108a is not formed, interconnection line 108b is formed and nodes 106a and 106b are connected. These interconnection lines 108a and 108b are mask interconnection lines, and are alternatively formed with a mask in the manufacturing process.

The column decoder enable signal generating portion further includes an inverter 111 which inverts a signal on node 106b to output column decoder enable signal CDE, an inverter latch 110 which latches a signal on node 106b, and a p channel MOS transistor 109 which resets node 106b to supply voltage Vcc level in response to reset signal ZCAR. Inverter latch 110 includes two stages of inverters connected in series, and latches a signal on node 106b with a relatively weak latching capability. An operation of the column decoder enable signal generating portion illustrated in FIG. 37 is now briefly described referring to the signal waveforms shown in FIGS. 38 and 39.

Figure 38:
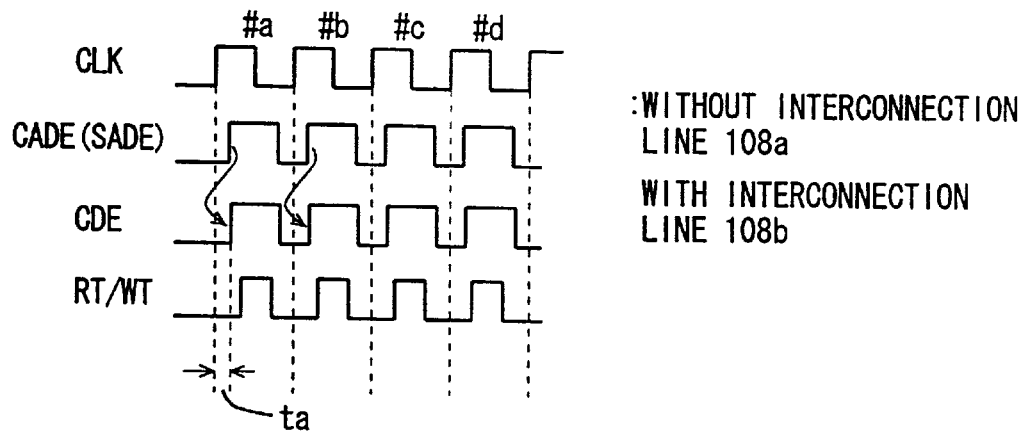
FIG. 38 is a timing chart representing an operation of the column decoder enable signal generating portion shown in FIG. 37.

Referring to FIG. 38, an operation in the case that interconnection line 108a is not formed and interconnection line 108b is formed. In this state, nodes 106a and 106b are connected. When internal clock signal CLK rises to H level in clock cycle #a, column address activation signal CADE is activated accordingly. Column address activation signal CADE is activated at a timing preceding the activation of read trigger signal RT or write trigger signal WT. In response to activation of column address activation signal CADE, n channel MOS transistor 107a is rendered conductive to discharge nodes 106a and 106b to the ground voltage level. Accordingly, column decoder enable signal CDE from inverter 111 rises to H level.

In the following clock cycles #b to #d, counter address activation signal SADE is activated in response to rising of internal clock signal CLK. Counter address activation signal SADE is also activated at a timing preceding the activation of read trigger signal RT and write trigger signal WT. In response to activation of counter address activation signal SADE, MOS transistor 107b is rendered conductive, nodes 106a and 106b are discharged to the ground voltage level, and column decoder enable signal CDE from inverter 111 rises to H level. In each cycle, column decoder enable signal CDE is reset by reset signal ZCAR.

When interconnection line 108a is not formed and interconnection line 108b is formed, column decoder enable signal CDE is activated in response to activation of counter address activation signal SADE and column address activation signal CADE. Column decoder enable signal CDE is activated at a liming preceding activation of read trigger signal RT or write trigger signal WT. In other words, the column decoder enable signal is activated regardless of whether data are read or data are written. When internal column address signal is defined, the column decoder operates to perform the column selecting operation at an advanced timing. In the column selecting operation, data reading/writing is determined according to read trigger signal RT or write trigger signal WT, and access of memory cell data is made to a selected column. Consequently, the column decoder can be activated at an advanced timing (column decoder enable signal CD can be activated after time ta passes from the time at which internal clock signal CLK rises), achieving a high speed access.

Figure 39:
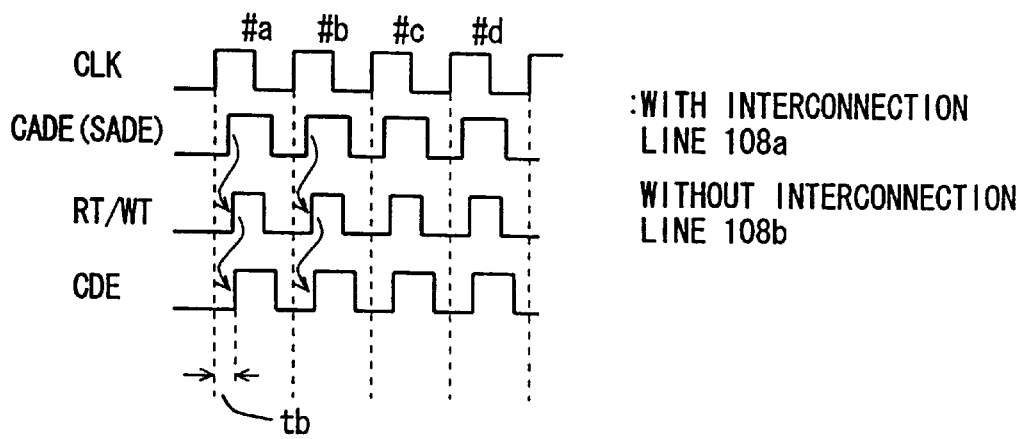
FIG. 39 is a timing chart reprinting an operation of the column decoder enable signal generating portion shown in FIG. 37.

Referring now to FIG. 39, an operation which is performed when interconnection line 108a is formed and interconnection line 108b is not formed is described. In this state, nodes 106a and 106b are electrically isolated from each other and node 106a is held at the ground voltage level. When column address activation signal CADE is activated, read trigger signal RT or write trigger signal WT is activated. In response to the activation of read trigger signal RT or write trigger signal WT, MOS transistor 107c or 107d is rendered conductive, node 106b is discharged to the ground voltage level, and column decoder enable signal CDE rises to H level via inverter 111. After prescribed time elapses, reset signal ZCAR is set into the active state of L level, node 106b is again precharged to power supply voltage Vcc level by MOS transistor 109, and column decoder enable signal CDE changes its state from H level to L level.

In clock cycles #b to #d, after counter address activation signal SADE is activated, read trigger signal RT or write trigger signal WT is activated. According to activation of read trigger signal RT or write trigger signal WT, MOS transistor 107c or 107d is set into the conductive state, node 106b is discharged to the ground voltage level, and column decoder enable signal CDE attains the active state of the H level. In each clock cycle, node 106b is precharged to power supply voltage Vcc level according to reset signal ZCAR, and column decoder enable signal CDE is inactivated.

According to the operation mode represented by FIG. 39, internal clock signal CLK rises, column address activation signal CADE or counter address activation signal SADE is activated, and column decoder enable signal CDE is activated after read trigger signal RT or write trigger signal WT is activated. Column decoder enable signal CDE is driven into the active state after time tb passes from the time at which internal clock signal CLK rises. In this case, time tb is longer than time ta shown in FIG. 38. The internal column selecting operation is started at a timing behind the timing achieved by the structure shown in FIG. 38.

If internal clock signal CLK is a high speed clock signal, the column decoder is activated at a fast timing before determination is made as to whether the access is data reading or data writing. If internal clock signal CLK has a lower frequency and operation is performed at a low speed, column decoder is activated at a relatively late timing. Consequently, the column decoder can be operated at an optimum timing according to the frequency of the clock signal. If the clock signal is slow speed one, there is a margin for timing at which the column selecting operation is internally started in the case of the high speed operation, so that the timing of activating the column decoder is delayed. By operating the column decoder after the internal column address signal is defined and whether data writing or data reading is to be done is determined, the column decoder can be activated in a successive operation sequence for the reading operation and the writing operation and accordingly, data can be written/read stably.

In the structure illustrated in FIG. 37, column address activation signal CADE and counter address activation signal SADE are used. The voltage level on node 106b is latched by inverter latch 110. Therefore, in place of these counter address activation signal SADE and column address activation signal CADE, a one-shot pulse which is in synchronization with these signals may be used.

Figure 40A:
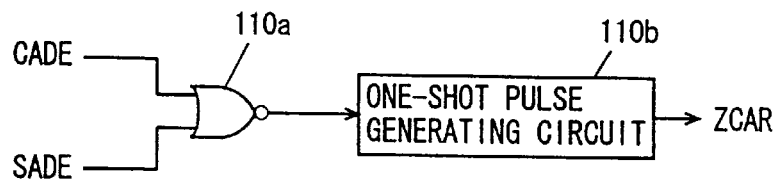
FIG. 40A illustrates a structure of a reset signal generating portion shown in FIG. 37.

FIG. 40A illustrates one example of a structure of the portion which generates reset signal ZCAR. Referring to FIG. 40A, a reset signal generating portion includes an NOR circuit 110a receiving column address activation signal CADE and counter address activation signal SADE, and a one-shot pulse generating circuit 110b generating a one-shot pulse signal in response to rising of an output signal of NOR circuit 110a. One-shot pulse generating circuit 110b generates a one-shot pulse signal which falls to L level for a prescribed period when an output signal of NOR circuit 110a rises to H level, and outputs the generated signal as reset signal ZCAR.

Figure 40B:
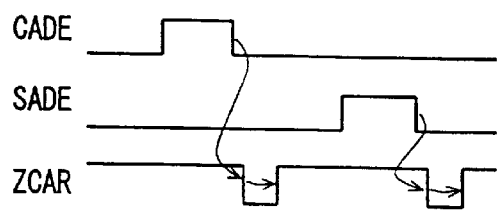
FIG. 40B illustrates signal waveforms representing a circuit operation shown in FIG. 40A.

Specifically, referring to FIG. 40B, when column address activation signal CADE is driven to the active state, counter address activation signal SADE is at L level. When column address activation signal CADE is set into the inactive state of L level, an output signal of NOR circuit 11a attains H level, and reset signal ZCAR from one-shot pulse generating circuit 110b is at L level for prescribed period. Consequently, MOS transistor 109 for reset shown in FIG. 37 is rendered conductive to charge node 106b to power supply voltage Vcc level.

When counter address activation signal SADE is activated, column address activation signal CADE maintains L level. In this state, reset signal ZCAR is set at L level for a prescribed period in response to falling of counter address activation signal SADE. In each clock cycle, node 106b can be prechanged to the power supply voltage level to inactivate column decoder enable signal CDE.

Modification

Figure 41A:
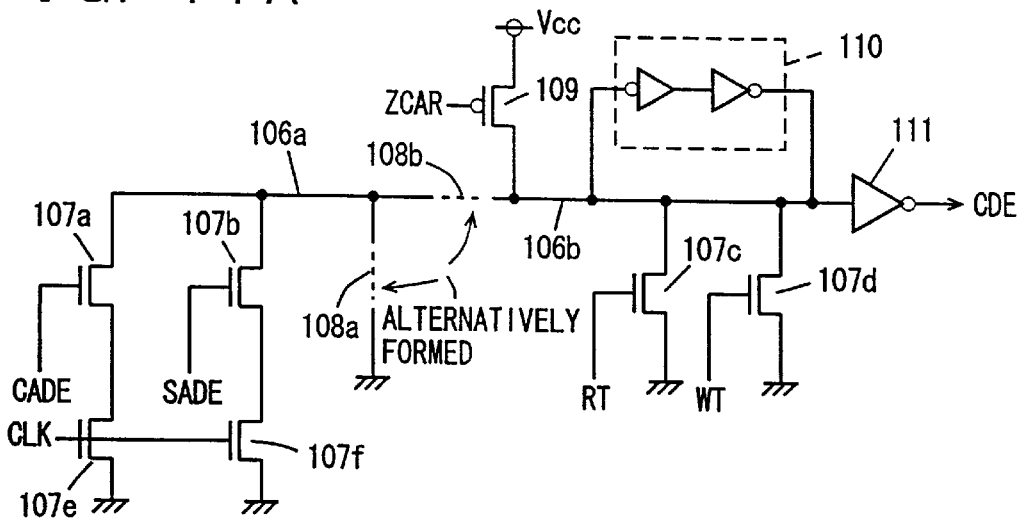
FIG. 41A illustrates a structure of a modification of the column decoder enable signal generating portion.

FIG. 41A illustrates a structure of a modification of the sixth embodiment of the present invention. Referring to FIG. 41A, a column decoder enable signal generating portion includes, in addition to the circuit components illustrated in FIG. 37, an n channel MOS transistor 107e receiving internal clock signal CLK at its gate and connected in series with MOS transistor 107a, and an n channel MOS transistor 107f receiving internal clock signal CLK at its gate and connected in series with MOS transistor 107b. Other circuit components are similar to those illustrated in FIG. 37, corresponding components have the same reference characters, and a detailed description thereof is omitted.

In the structure shown in FIG. 41A, MOS transistors 107e and 107f are set into the conductive state when internal clock signal CLK is at H level. When internal clock signal CLK is at L level, MOS transistors 107e and 107f are in the non-conductive state to isolate node 106a from ground node. The activation period of column decoder enable signal CDE can be reduced compared with the activation period of address activation signals SADE and CADE by activating reset signal ZCAR independently of address activation signals CADE and SADE.

Figure 41B:
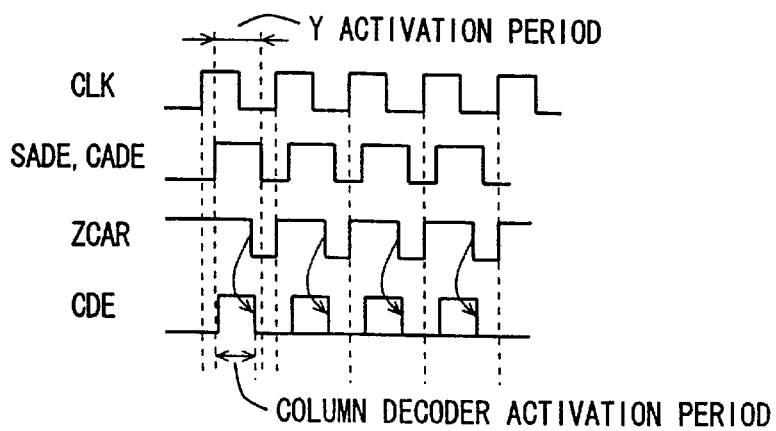
FIG. 41B is a timing chart representing a circuit operation shown in FIG. 41A.

Specifically, referring to FIG. 41B, address activation signal CADE or SADE is driven into the active state after internal clock signal CLK rises. Even if internal clock signal CLK falls to L level, address activation signal CADE or SADE maintains H level of the active state. During the period in which address activation signals CADE and SADE are in the active state, predecode signal Y or internal column address signal CA is in the active state as described in connection with the first to the fourth embodiments. When address activation signal CADE or SADE is in the active state, reset signal ZCAR is driven into the active state of L level. Accordingly, column decoder enable signal CAD falls to L level, the activation period of column decoder enable signal CDE can be reduced relatively to the activation period of address activation signal CADE or SADE, that is, the activation period of the internal column address signal or the predecode signal. Consequently, malfunction of the column decoder caused by the reset predecode signal can be prevented because the column decoder is set in the inactive state before internal predecode signal Y is reset.

When node 106a is connected to node 106b via interconnection line 108b, even if MOS transistors 107a, 107b, 107e and 107f are set into the non-conductive state by falling of clock signal CLK, inverter latch 110 holds the voltage level of nodes 106a and 106b at L level, causing no problem. Therefore, if column decoder enable signal CDE is activated according to address activation signal CADE or SADE, or trigger signal RT or WT, the timing at which column decoder enable signal CDE is inactivated can be determined based on falling of internal clock signal CLK.

Figure 42A:
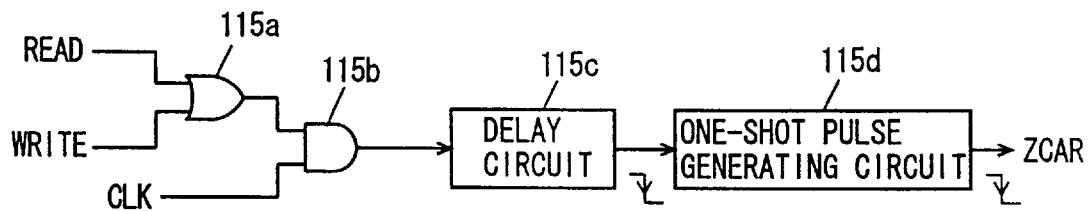
FIG. 42A is a schematic view illustrating a reset signal generating portion shown in FIG. 41A.
Figure 42B:
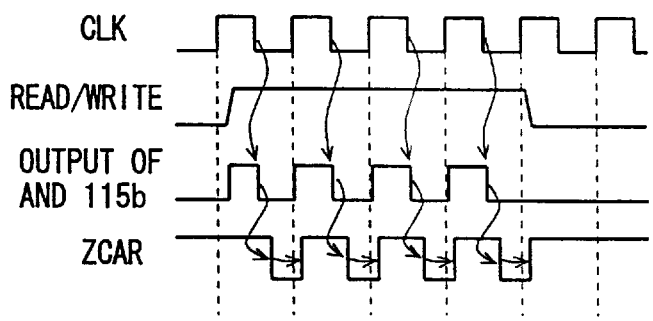
FIG. 42B is a timing chart representing a circuit operatic shown in FIG. 42A.

FIG. 42A is a schematic diagram illustrating a structure of a reset signal generating portion according to this modification. Referring to FIG. 42A, the reset signal generating portion includes an OR circuit 115a receiving reading operation activation signal READ and waiting operation activation signal WRITE, an AND circuit 115b receiving an output signal of OR circuit 115a and internal clock signal CLK, a delay circuit 115c delaying an output signal of AND circuit 115b by a prescribed time, and a one-shot pulse generating circuit 115d generating a one-shot pulse signal which is set at L level for a prescribed period in response to falling of an output signal of delay circuit 115c. Reset signal ZCAR is output from one-shot pulse generating circuit 115d. An operation of the reset signal generating portion illustrated in FIG. 42A is now described referring to the timing chart of FIG. 42B.

When a read command or a write command is supplied, reading operation activation signal READ or writing operation activation signal WRITE attains H level in response to rising of internal clock signal CLK. Activation signal READ or WRITE is held at H level for a burst length period. Accordingly, a signal synchronous with internal clock signal CLK is output from AND circuit 115b during a period in which activation signal READ or WRITE is at H level. Delay circuit 115c delays the output signal of AND circuit 115b by a prescribed time.

One-shot pulse generating circuit 115d drives reset signal ZCAR to L level after a prescribed period passes from the time at which internal clock signal CLK falls. The reset operation is repeatedly performed during the burst length period. By utilizing the structure illustrated in FIG. 42A, column decoder enable signal CDE can be reset at a prescribed timing and the activation period of column decoder enable signal CDE can be set at an optimum value even if column decoder enable signal CDE is activated in response to activation of signals CADE and SADE or RT and WT.

Figure 43A:
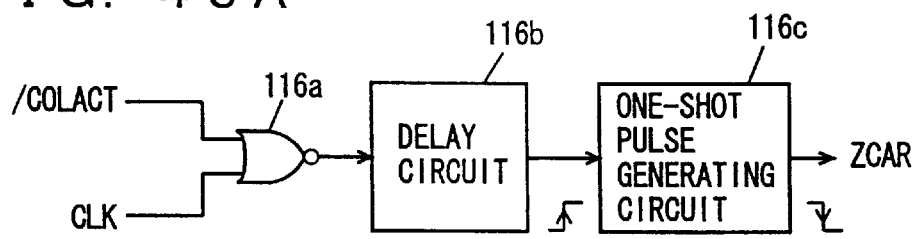
FIG. 43A illustrates another structure of the reset signal generating portion shown in FIG. 41A.
Figure 43B:
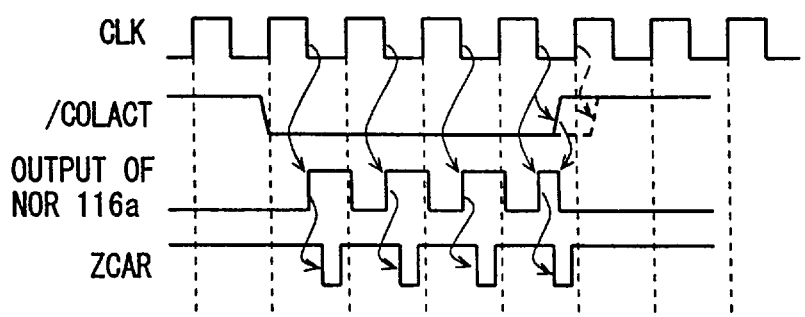
FIG. 43B is a timing chart representing an operation of the circuit shown in FIG. 43A.
Figure 44:
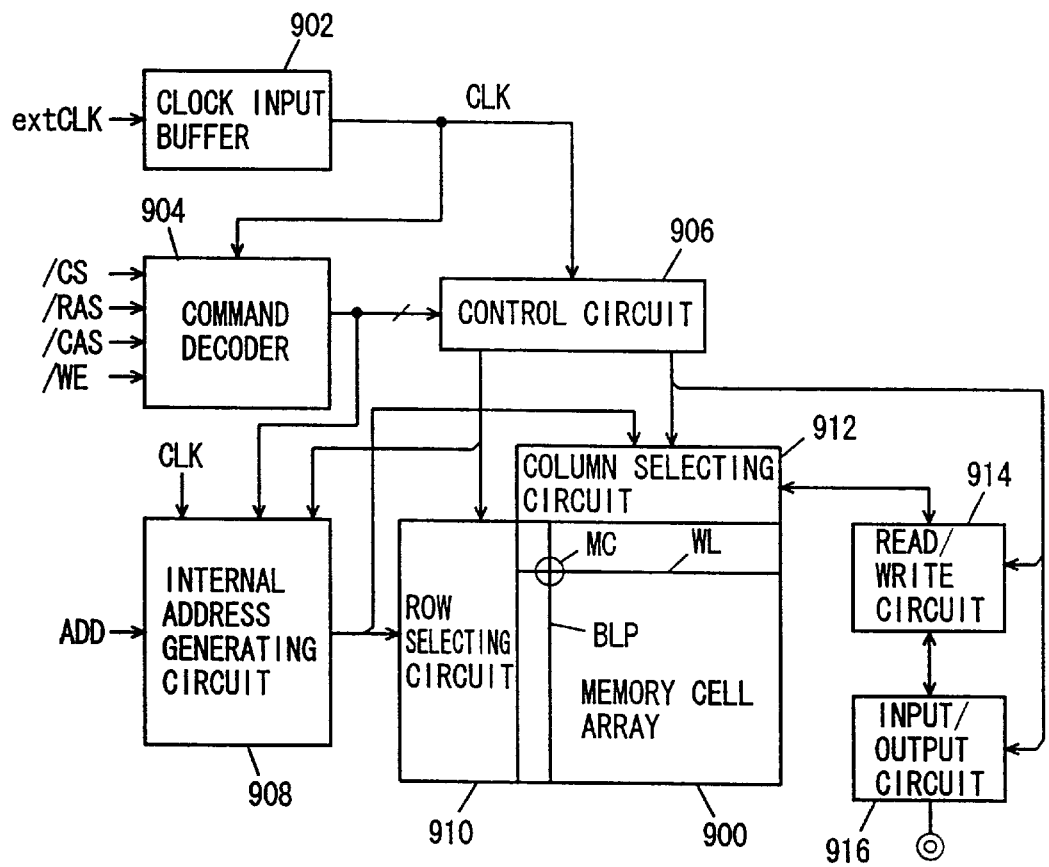
FIG. 44 is a schematic diagram illustrating an entire structure of a conventional synchronous semiconductor memory device.
Figure 45:
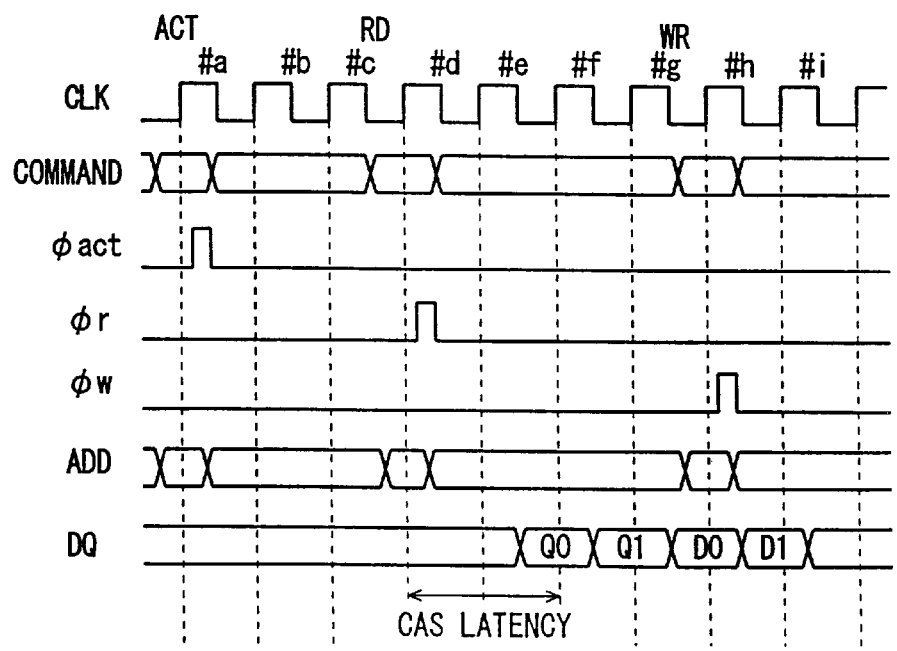
FIG. 45 is a timing chart representing an operation of the synchronous semiconductor memory device shown in FIG. 44.
Figure 46:
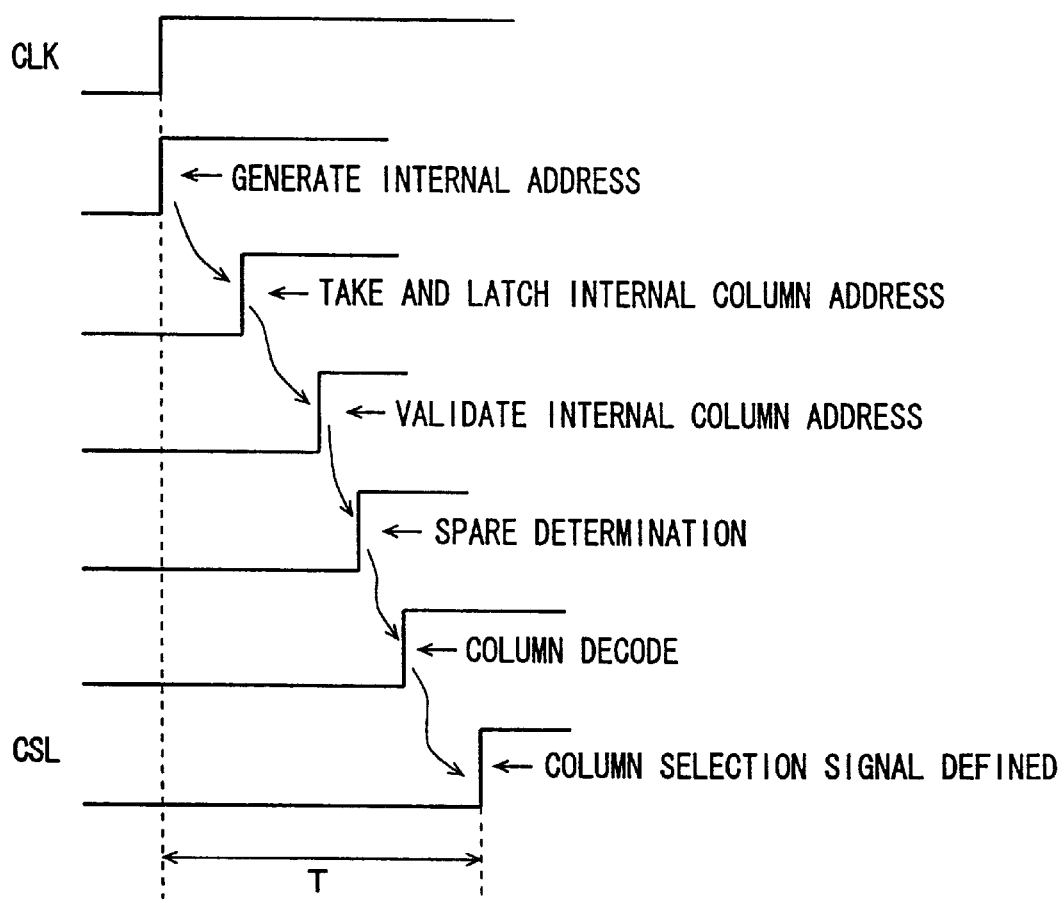
FIG. 46 illustrates a column selecting operation sequence in the synchronous semiconductor memory device.

FIG. 43A illustrates another structure of the reset signal generating portion. Referring to FIG. 43A, the reset signal generating portion includes an NOR circuit 116a receiving column selecting operation activation signal /COLACT and internal clock signal CLK, a delay circuit 116b delaying an output signal of NOR circuit 116a by a prescribed time, and a one-shot pulse generating circuit 116c generating a one-shot pulse signal in response to rising of an output signal of delay circuit 116b. Reset signal ZCAR is output from one-shot pulse generating circuit 116c. Column selecting operation activation signal /COLACT is generated using the circuit structure shown in FIG. 5, and is driven to the active state of L level for the burst length period when an access command is supplied. An operation of the reset signal generating portion shown in FIG. 43A is now described referring to the timing chart of FIG. 43B.

When an access command is supplied, column selecting operation activation signal /COLACT is driven to L level for the burst length period. When column selecting operation activation signal /COLACT is driven to L level, an inverted version of internal clock signal CLK is output from NOR circuit 116a. Delay circuit 110b delays the output signal of NOR circuit 116a by a prescribed time. One-shot pulse generating circuit 116c generates a one-shot pulse signal which is held at L level for prescribed period in response to rising of an output signal of delay circuit 116b. Accordingly, reset signal ZCAR is at L level for the prescribed period after a prescribed time passes from the time at which internal clock signal CLK falls, and column decoder enable signal CDE is reset.

According to the circuit structure shown in FIG. 43A, column selecting operation activation signal /COLACT is driven to the inactive state of H level in response to rising of internal clock signal CLK after the burst length period passes. In this case, reset signal ZCAR might be incompletely formed to cause the incomplete resetting in the last cycle. In this case, with an arrangement in which an output signal of burst length counter 11c shown in FIG. 5 is delayed by a half clock cycle to reset the set/reset flip-flop in response to rising of internal clock signal CLK, column selecting operation activation signal /COLACT attains H level of the inactive state in synchronization with rising of internal clock signal CLK after the burst length period passes, NOR circuit 116a can appropriately output a signal which is at H level for a period in which internal clock signal CLK is at L level, and reset signal ZCAR can be activated correctly.

According to the sixth embodiment of the present invention, the activation timing of the column decoder is set by either one of the address activation signal and the read trigger signal/write trigger signal, so that the column decoder can operate at an optimum timing according to the frequency of the clock signal.

Another Application

According to the description above, the internal column address or the predecode signal is reset to the initial state by column address activation signal CADE or counter address activation signal SADE. However, if a latch circuit is provided to the internal column address signal generating portion and the predecode signal generating portion, the internal column address or the predecode signal can be reset by another reset signal (see FIG. 8A for example) different from address activation signals CADE and SADE to achieve a high speed operation. Therefore, the first through fifth embodiments all may be combined to be used or the first to the fifth embodiments may be applied to a conventional synchronous semiconductor memory device individually. Further, internal column address signal CA and predecode signal Y may be generated in the form of a one-shot pulse (reset pulse is unnecessary).

According to the sixth embodiment, the activation timing of the column decoder enable signal is adjusted by the mask interconnection line such as the aluminum interconnection line. However, a structure may be employed in which the activation timing of column decoder enable signal CDE is adjusted by fixedly setting the potential on a specific bonding pad. It is only required to provide a switching element which is selectively rendered conductive/non-conductive according to the potential on the bonding pad in place of the interconnection portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device comprising:

command decode circuitry for receiving and decoding an externally supplied command asynchronously with a clock signal, to activate a column access mode instruction signal when the received command is an access command designating a column access;

first circuitry for taking and latching said column access mode instruction signal from said command decode circuitry in synchronization with said clock signal to generate a column address activation signal;

first address generating circuitry for generating an internal column address signal from an externally supplied address signal according to the column address activation signal from said first circuitry;

column control circuitry for generating a column selection activation signal activated over a period of a prescribed number of cycles of said clock signal in response to said column access mode instruction signal;

second circuitry for generating a counter address activation signal in synchronization with said clock signal in response to activation of said column selection activation signal and inactivation of said column access mode instruction signal;

a counter for performing a counting operation in a prescribed sequence in synchronization with said clock signal with said externally supplied address signal being a starting count value; and second address generating circuitry for taking an output count value from said counter in response to said counter address activation signal to generate the internal column address signal, the first and second address generating circuitry sharing an output stage.

2. The synchronous semiconductor memory device according to claim 1, wherein the first and second circuitry include circuits for outputting said column address activation signal and said counter address activation signal in a form of a one-shot pulse, respectively.

3. The synchronous semiconductor memory device according to claim 1, wherein said first address generating circuitry includes a circuit for taking said externally supplied address signal in synchronization with said clock signal to generate an address signal corresponding to said externally supplied address signal, and outputting the generated address signal as said internal column address signal in response to said column address activation signal.

4. The synchronous semiconductor memory device according to claim 1, wherein
the output stage of each of the first and second address generating circuitry includes a latch circuit for latching said internal column address signal.

5. The synchronous semiconductor memory device according to claim 1, wherein
said first address generating circuitry includes a first logic gate receiving said column address activation signal and said externally supplied address signal,
said second address generating circuitry includes a second logic gate receiving said counter address activation signal and a count from said counter, and
the output stage shared between the first and second address generating circuitry includes a third logic gate receiving output signals of the first and second logic gates to output said internal column address signal.

6. The synchronous semiconductor memory device according to claim 1, further comprising a circuit for inactivating said counter address activation signal in response to activation of said column address activation signal.

7. A synchronous semiconductor memory device comprising:
command decode circuitry for receiving and decoding an externally supplied command asynchronously with a clock signal, to activate a column access mode instruction signal when the received command is an access command designating a column access;

first circuitry for taking and latching said column access mode instruction signal from said command decode circuitry in synchronization with said clock signal to generate a column address activation signal;

first address generating circuitry for generating an internal column address signal from an externally supplied address signal according to the column address activation signal from said first circuitry;

a counter for taking in the externally supplied address signal as an initial value to perform a counting operation in a prescribed sequence according to said clock signal over a period of a prescribed number of cycles of the clock signal in response to activation of said column access mode instruction signal;

a counter command decode circuit for receiving and decoding the externally supplied command independently of said clock signal to generate a counter address validating signal when the received command indicates that a count value of said counter is valid;

second circuitry for taking and latching said counter address validating signal in synchronization with said clock signal to generate a counter address activation signal; and a circuit for generating said internal column address signal according to the counter value of said counter when said counter address activation signal is activated.

* * * * *